(12) United States Patent
Wakita

(10) Patent No.: US 7,746,418 B2
(45) Date of Patent: Jun. 29, 2010

(54) CONDUCTIVE THIN FILM AND THIN FILM TRANSISTOR

(75) Inventor: Naohide Wakita, Osaka (JP)

(73) Assignee: Panasonic Corporation, Osaka (JP)

( * ) Notice: Subject to any disclaimer, the term of this patent is extended or adjusted under 35 U.S.C. 154(b) by 1055 days.

(21) Appl. No.: 10/577,643

(22) PCT Filed: Oct. 28, 2004

(86) PCT No.: PCT/JP2004/016049

§ 371 (c)(1),
(2), (4) Date: May 1, 2006

(87) PCT Pub. No.: WO2005/043639

PCT Pub. Date: May 12, 2005

(65) Prior Publication Data

US 2008/0277648 A1   Nov. 13, 2008

(30) Foreign Application Priority Data

Oct. 30, 2003  (JP) ............... 2003-370384
Nov. 18, 2003  (JP) ............... 2003-387885
Nov. 19, 2003  (JP) ............... 2003-389104

(51) Int. Cl.
G02F 1/136   (2006.01)
H01L 51/00   (2006.01)
H01L 35/24   (2006.01)

(52) U.S. Cl. ............ 349/43; 257/40; 252/299.01; 438/149

(58) Field of Classification Search .......... 349/43; 257/40; 438/149; 252/299.01
See application file for complete search history.

(56) References Cited

U.S. PATENT DOCUMENTS 6,326,640 B1 * 12/2001 Shi et al. ............... 257/40
2003/0021912 A1  1/2003 Farrand et al.

FOREIGN PATENT DOCUMENTS

| JP | 09-083040 | 3/1997 |
|---|---|---|
| JP | 2000-029403 | 1/2000 |
| JP | 2001-354966 | 12/2001 |
| JP | 2002-365427 | 12/2002 |

OTHER PUBLICATIONS

Dimitrakopoulos et al., "Organic thin-film transistors: A Review of recent advances", IBM J. Res. & Dev. vol. 45, No. 1, Jan. 2001.
Avouris "Carbon nanotube electronics", Chemical Physics 281 (2002) 429-445.

(Continued)

Primary Examiner—Jerry T Rahll
(74) Attorney, Agent, or Firm—McDermott Will & Emery LLP

(57) ABSTRACT

To provide an inexpensive and flexible conductive thin film which is excellent in carrier mobility and electric conductivity and which is formed by highly orienting nanotube or an electronic functional organic material by simple and convenient means, as well as a thin film transistor using the conductive thin film.

A conductive thin film (1) is formed by mixing a first material (5) having electric conductivity or semiconductivity and a second material (6) to prepare a mixture and orienting the mixture by utilizing liquid crystallinity thereof.

36 Claims, 13 Drawing Sheets

OTHER PUBLICATIONS

Supplementary European Search Report issued in European Patent Application No. EP 04793157.1-1235/1679752 PCT/JP2004016049, dated Sep. 8, 2009.

Michael D. Lynch et al., "Organizing Carbon Nanotubes with Liquid Crystals," Nano Letters 2002, vol. 2, No. 11, pp. 1197-1201, XP-002471689.

* cited by examiner

US 7,746,418 B2

CONDUCTIVE THIN FILM AND THIN FILM TRANSISTOR

This application is the U.S. National Phase under 35 U.S.C. §371 of International Application No. PCT/JP2004/016049, filed Oct. 28, 2005, which in turn claims the benefit of Japanese Application No. 2003-370384, filed Oct. 30, 2003, Japanese Application No. 2003-387885, filed Nov. 18, 2003, and Japanese Application No. 2003-389104, filed Nov. 19, 2003, the disclosures of which applications are incorporated by reference herein in their entirety.

TECHNICAL FIELD

The present invention relates to a conductive thin film formed by orienting nanotube or an organic semiconductor compound as well as a thin film transistor employing the same as a semiconductor layer.

BACKGROUND ART

A thin film transistor (TFT) for use in flat panel displays and the like has a structure wherein source and drain electrodes are disposed on one side of a semiconductor layer forming part of the thin film transistor and a gate electrode disposed on the other side of the semiconductor layer at a substantially central position relative to a channel.

Usually, a semiconductor layer of a thin film transistor having the above-described structure is formed by processing a semiconductor thin film formed on a substrate under precise control based on a thin film control process. Here, the semiconductor layer of the thin film transistor formed by the thin film control process calls for an excellent carrier mobility for a semiconductor device to be constructed. To this end, conventional thin film transistors preferentially employ inorganic semiconductors having excellent levels of carrier mobility such as silicon and germanium as semiconductor materials forming such semiconductor layers.

With recent prevalence of mobile information processing terminals such as PDA and the like, demands exist for realization of sheet-like or paper-like high-definition displays of low prices, microelectronic devices of low prices, and like devices. To meet these demands, realizations of inexpensive flexible electrodes and wiring and of flexible miniature thin film transistors of low prices are demanded. In forming such inexpensive flexible electrodes and thin film transistors or the like, it is required that conductor layers and semiconductor layers be imparted with flexibility by inexpensive means. For this reason, conductor and semiconductor materials are being sought which can replace the aforementioned inorganic semiconductors and which can impart resulting conductor and semiconductor layers with flexibility inexpensively.

In recent years, attention has been focused on electronic functional organic materials each comprising such an organic semiconductor compound as thiophene, pentacene or the like as a conductor material for forming a conductor layer to be used as an electrode, wiring or the like and as a semiconductor material for forming a semiconductor layer for use in such a semiconductor device as a thin film transistor, an organic electroluminescent device (organic EL) or the like.

Such an electronic functional organic material has a characteristic that it can be deposited at room temperature or at a temperature close to room temperature. Accordingly, use of such an electronic functional organic material makes it possible to form a conductor or semiconductor layer by a low-temperature process. For this reason, it is possible to form a conductor or semiconductor layer by the use of relatively inexpensive fabrication equipment adapted to the low-temperature process without the need to provide expensive fabrication equipment adapted to a high-temperature process that is needed when using an inorganic semiconductor. In brief, such a conductor or semiconductor layer can be formed inexpensively.

These electronic functional organic materials generally have flexibility. Accordingly, the use of such an electronic functional organic material for a conductor or semiconductor layer makes it possible to impart the layer with flexibility. For this reason, if a conductor or semiconductor layer comprising an electronic functional organic material is formed on a flexible plastic substrate or resin film, it becomes possible to fabricate an electrode, thin film transistor or the like having flexibility easily. Use of such a flexible electrode, flexible thin film transistor or the like enables a sheet-like or paper-like display or electronic device or the like to be constructed easily.

Examples of known thin film transistors of the type using an electronic functional organic material in a semiconductor layer include one having a semiconductor layer comprising oligothiophene which is an organic semiconductor compound. The semiconductor layer of this thin film transistor comprises an oligothiophene thin film formed by evaporating oligothiophene on a substrate or depositing oligothiophene on the substrate by coating the substrate with a solution of oligothiophene in an organic solvent. However, since the semiconductor layer of this known thin film transistor is formed by mere evaporation or deposition of oligothiophene without orientation or alignment, the thin film transistor has a far lower carrier mobility at channel than a thin film transistor using silicon or the like. The carrier mobility of such a thin film transistor having a semiconductor layer formed by mere evaporation or deposition of oligothiophene is about 0.001 $cm^2/Vs$ for example (see patent document 1 for example).

Thus, such a conductor or semiconductor layer comprising an electronic functional organic material has a problem that the carrier mobility thereof is considerably lower than that of a layer comprising an inorganic semiconductor. Specifically, the carrier mobility of single-crystalline silicon is about $10^3$ $cm^2/Vs$, that of polycrystalline silicon about $10^2$ $cm^2/Vs$, and that of amorphous silicon about 1 $cm^2/Vs$, whereas that of a layer comprising such an electronic functional organic material as oligothiophene is about 0.001 to about 0.01 $cm^2/Vs$.

The carrier mobility of the conductor or semiconductor layer comprising an electronic functional organic material is considerably lower than that of the layer comprising an inorganic semiconductor because the conductor or semiconductor layer formed by mere evaporation or deposition of the electronic functional organic material has electronic functional organic material molecules therein with their axes positioned disorderly, which impedes smooth charge transfer between plural electronic functional organic material molecules, thus lowering the electric conductivity of the layer. For this reason, it has been difficult for the prior art to use electronic functional organic materials in forming a conductor layer for use as an electrode, wiring or the like or in forming a semiconductor layer in a semiconductor device such as a thin film transistor, an organic electroluminescent device or the like, particularly, a semiconductor layer in a high-definition image display device, a high-speed LSI, or the like.

In attempt to overcome this difficulty, various studies have heretofore been made with a view to improving the carrier mobility of a conductor or semiconductor layer comprising an electronic functional organic material.

For example, a thin film transistor has been reported in which a crystalline low-molecular electronic functional organic material comprising pentacene or the like is used as an electronic functional organic material to form a semiconductor layer in which the low-molecular electronic functional organic material is oriented and aligned by an evaporation technique (see non-patent document 1 for example).

In this thin film transistor having the semiconductor layer formed by orienting and aligning the low-molecular electronic functional organic material, pentacene, which is an organic semiconductor material, is evaporated on a substrate to form the semiconductor layer of the thin film transistor. Here, pentacene is evaporated at a deposition rate of 1 Å/s on the substrate surface in which the temperature is room temperature (27° C.). This evaporation process causes pentacene molecules to be substantially aligned in the direction normal to the substrate thereby realizing a thin film phase having poor grain boundary. It has been reported that such a structure realized a thin film transistor having a semiconductor layer having a carrier mobility of about 0.6 $cm^2/Vs$, which is a relatively high value among values of carrier mobility obtained from semiconductor layers formed by using electronic functional organic materials.

As another art, there has been disclosed a thin film transistor having a semiconductor layer comprising an organic semiconductor polymer in which a liquid crystalline substituent group is introduced at side chain, wherein the skeletal chains of the organic semiconductor polymer are aligned in a predetermined direction (see patent document 2 for example).

In this thin film transistor having the semiconductor layer formed by using the organic semiconductor polymer in which a liquid crystalline substituent group is introduced at side chain, the semiconductor layer comprises a liquid crystalline phase of a polythiophene derivative in which such a liquid crystalline substituent group as phenylcyclohexane (PCH)-type substituent is introduced at the 2- or 3-position of thiophene. It has been disclosed that the thin film transistor having a carrier mobility at channel of $6 \times 10^{-5}$ $cm^2/Vs$ was obtained by orientation of the backbone chain axis of the thiophene polymer caused by orientation of the liquid crystalline substituent group in the liquid crystalline phase.

FIG. 19 is a sectional view schematically showing a sectional structure of the thin film transistor according to the aforementioned patent document 2.

As shown in FIG. 19, the thin film transistor 100 according to patent document 2 includes an insulating substrate 101 formed with a gate electrode 103, and an organic semiconductor film 106 formed over the insulating substrate 101 with a gate insulator 102 intervening therebetween. Further, between the insulating substrate 101 and the organic semiconductor film 106 are formed a source electrode 104 and a drain electrode 105 in such a manner as to connect to the organic semiconductor film 106 directly. The organic semiconductor film 106 is formed by a process including: polymerizing a PCH-type liquid crystal compound (PCH504) and thiophene by a catalytic polymerization method; dissolving the resulting polymer in a chloroform solvent to exhibit a liquid crystalline phase; and coating the upper sides of the gate insulator 102, source electrode 104 and drain electrode 105 with the resulting solution to a film thickness of 1 μm by a casting method. The organic semiconductor film 106 extending over the source and drain electrodes 104 and 105 is subjected to a treatment for orientation control. In the organic semiconductor film 106, the liquid crystalline substituent group introduced in the organic semiconductor polymer forming the organic semiconductor film 106 can be oriented parallel with a rubbing direction. Since the organic semiconductor film 106 formed is thin, the skeletal chains of the organic semiconductor polymer are aligned in a fixed direction relative to the liquid crystalline substituent group, or side chain. Stated otherwise, in the thin film transistor 100 the direction in which the skeletal chains of the organic semiconductor polymer are aligned is controlled by controlling the alignment direction of the liquid crystalline substituent groups by an orientation treatment.

In recent years, attention has also been focused on nanotube (NT) having a nanostructure, particularly, carbon nanotube (CNT), which is an inorganic compound formed from carbon (C) as a semiconductor material for forming a conductor or semiconductor layer.

In these days, many studies are being made of nanotube (NT) and carbon nanotube (CNT) since they exhibit very good electric conductivity and high mechanical strength and are very stable chemically and thermally.

A carbon nanotube has a very small diameter on a nanometer order and a length on a micrometer order and hence has a very high aspect ratio. Therefore, carbon nanotube is extremely close to an ideal one-dimensional system. Such carbon nanotubes include a metallic carbon nanotube having a high electric conductivity and a semiconductive carbon nanotube having a band gap in inverse proportion to the diameter thereof, which are produced in accordance with the diameter and the helical degree which depend upon the symmetry of the molecular structure thereof. Usually, carbon nanotube is synthesized as a carbon nanotube mixture comprising the metallic carbon nanotube and the semiconductive carbon nanotube in proportions of about 1:2 for example. Since the metallic carbon nanotube has a high electric conductivity, it is possible to use the metallic carbon nanotube as a favorable wiring material or as a conductive member for use in devices of microstructure. In using carbon nanotube in a semiconductor layer of a thin film transistor, it is required that the semiconductive carbon nanotube be used. Such a thin film transistor having a semiconductor layer formed by using the semiconductive carbon nanotube can obtain a very high carrier mobility at channel of 1000 to 1500 $cm^2/Vs$.

A report has been made of a nanotube-type thin film transistor having a semiconductor layer comprising carbon nanotube, wherein the semiconductor layer is formed to a thickness of about 1.4 nm by dispersing carbon nanotubes each having a diameter of about 1.4 nm at an appropriate dispersion density (see non-patent document 2 for example).

FIG. 18 is a sectional view schematically showing the construction of a thin film transistor having a semiconductor layer comprising carbon nanotubes.

According to non-patent document 2, a thin film transistor 200 as shown in FIG. 18 includes a 150 nm-thick gate insulator 202 comprising thermally oxidized silicon formed on an upper portion of a $p^+$ silicon substrate 201 which serves also as a gate electrode, and a 1.4 nm-thick semiconductor layer 203 formed by dispersing semiconductor-type carbon nanotubes of 1.4 nm diameter on the gate insulator 202 at an appropriate dispersion density. Also, a metal such as titanium (Ti) or cobalt (Co) is deposited on the surface of the semiconductor layer 203 by evaporation and, further, source electrode 204 and drain electrode 205 each comprising titanium carbide or cobalt are formed on upper sides of contact sections 206 and 207 in contact with the carbon nanotubes. The thin film transistor 200 is thus constructed. Such a construction yields a nanotube-type thin film transistor having a sufficiently high carrier mobility at channel and favorable electrical characteristics.

Patent Document 1: Japanese Patent Laid-Open Publication No. 2000-029403

Patent Document 2: Japanese Patent Laid-Open Publication No. HEI 09-083040

Non-patent Document 1: C.D. Dimitrakopoulos and another one, IBM J. RES. & DEV. VOL. 45 NO. 1 JAN. 2001 pp 19

Non-patent Document 2: PhaedonAvouris, Chem. phys. 281, pp. 429-445 (2002), FIG. 6, "Carbon nanotube electronics"

DISCLOSURE OF INVENTION

Problems to be Solved by Invention

According to the proposition that the aforementioned electronic functional organic material is used to form a conductor or semiconductor layer, however, the carrier mobility of the semiconductor layer is still lower than that of a semiconductor layer formed by using such an inorganic semiconductor as silicon due to the degree of orientation of the electronic functional organic material still remaining low, though the carrier mobility is somewhat improved as compared with a conventional semiconductor layer comprising the electronic functional organic material not oriented or aligned. That is, for the electronic functional organic material to be used in forming a semiconductor device, wiring or the like, it is required that the degree of orientation of the electronic functional organic material be further improved with the characteristics of the electronic functional organic material maintained to improve the flow characteristics of electrons or holes, thereby further improving the carrier mobility of the semiconductor layer or the electric conductivity of the conductor layer. In order to provide a conductor or semiconductor layer that can find applications in higher-performance and further miniaturized semiconductor devices which will be required in near future, the degree of orientation of the electronic functional organic material need be further improved to further enhance the carrier mobility.

According to the proposition made by non-patent document 1, in the formation of the semiconductor layer, pentacene, which is a low-molecular organic semiconductor compound, is evaporated on the substrate so as to be oriented and aligned; however, it is actually difficult to obtain pentacene crystal extending over a large area. Also, a thin film transistor having a semiconductor layer comprising pentacene crystal close to single crystal formed on a flexible substrate involves a problem that the semiconductor layer may be damaged by some manner of handling of the thin film transistor, which may result in a defect in the semiconductor layer. Further, there arise other problems that: since the vapor deposition rate of pentacene in the formation of the semiconductor layer is low, the fabrication time is lengthened; and since the evaporation apparatus is expensive, the cost of fabricating the thin film transistor is high.

According to the proposition made by patent document 2, in the formation of the semiconductor layer, the liquid crystalline polymer is used comprising a polythiophene derivative in which a liquid crystalline substituent group is introduced and the backbone chain of the polythiophene derivative is oriented by orientation of the liquid crystalline substituent group in the liquid crystalline phase. With this proposition, however, the PCH-type liquid crystal compound, which does not contribute to charge transfer, is chemically bonded as side chain to the polythiophene derivative is having a low carrier mobility. For this reason, the proposition cannot exert any favorable influence from the view point of charge transfer and hence has a difficulty in sufficiently enhancing the carrier mobility at channel, though is capable of forming a semiconductor layer in which an electronic functional organic material is oriented by a simple and convenient method.

According to the proposition made by non-patent document 2 that nanotube is used to form a conductor or semiconductor layer, nanotubes having a high value of carrier mobility are used and dispersed at an appropriate dispersion density to form the semiconductor layer. With this proposition, however, it is difficult to disperse nanotubes at a constant dispersion density. Further, if a semiconductor layer of a very small thin film transistor is to be formed, it is difficult to align and fix multiple nanotubes of nanostructure side by side without superposing them one upon another from the view point of fabrication process.

Such a conductor or semiconductor layer formed by dispersing nanotubes is poor in flex resistance. For this reason, it is difficult to form a conductor or semiconductor layer consisting only of nanotubes on such a flexible substrate as a plastic substrate. That is, such a structure makes it difficult to form a flexible electrode, a flexible thin film transistor or the like. In this connection, if a conductor or semiconductor layer is formed by using a composite-type material comprising a mixture of high-mobility nanotube and a flexible organic compound, formation of an electrode or thin film transistor which has a high value of carrier mobility and is flexible is considered to become possible. However, in the formation of such a conductor or semiconductor layer comprising the aforementioned composite-type material, mere mixing of the organic compound and nanotube causes nanotube molecules of a substantially one-dimensional shape to be positioned sparsely in random orientations and hence cannot provide for a conductor or semiconductor layer of high carrier mobility. For example, such a conductor layer comprising the aforementioned composite-type material has a low electric conductivity of about $10\ \Omega^{-1}\ cm^{-1}$. Further, the existing orientation treatment means has a difficulty in orienting nanotube satisfactorily.

In brief, even such a structure has a difficulty in improving a conductor or semiconductor layer in electric conductivity or carrier mobility because the fill density of nanotube molecules in the mixture and the density of electronic contacts between the nanotube molecules are low.

The present invention has been made in view of the foregoing circumstances. Accordingly, it is an object of the present invention to provide an inexpensive and flexible conductive thin film which is excellent in carrier mobility and electric conductivity and which is formed by highly orienting nanotube or an electronic functional organic material by simple and convenient means, as well as a thin film transistor employing the same.

Means for Solving Problems

In order to solve the foregoing problems, molecules of nanotube and organic compound having high carrier mobility or electric conductivity need be aligned densely and favorably at an improved degree of orientation in a predetermined direction by a simple method. By so doing, it becomes possible to further improve the fill density of nanotube in a mixture and the density of electronic contacts between nanotube molecules thereby to allow electrons or holes to flow more smoothly.

In order to solve the foregoing problems, the present invention provides a conductive thin film formed by mixing a first material having electric conductivity or semiconductivity and a second material to prepare a mixture and orienting the mixture by utilizing liquid crystallinity thereof.

The conductive thin film is formed by mixing at least nanotube comprising at least one of metallic nanotube and semiconductive nanotube and a liquid crystalline organic compound together and orienting molecules of the liquid crystalline organic compound to cause molecules of the nanotube to be oriented.

The aforementioned nanotube is carbon nanotube.

The aforementioned liquid crystalline organic compound is a liquid crystalline organic compound having at least one of a nematic liquid crystalline phase and a smectic liquid crystalline phase.

The aforementioned liquid crystalline organic compound is a liquid crystalline organic compound having a charge transport function.

The aforementioned liquid crystalline organic compound is a liquid crystalline organic compound having at least 16π-electron aromatic rings, m 10π-electron aromatic rings or n 14π-electron aromatic rings (wherein l+m+n=1 to 4; and l and n are each an integer from 0 to 4).

The aforementioned liquid crystalline organic compound is a liquid crystalline organic compound having at least any one of a 2-phenylnaphthalene ring, a biphenyl ring, a benzothiazole ring and a t-thiophene ring and a substantially rod-like molecular structure.

The conductive thin film is formed by mixing at least a non-liquid-crystalline organic semiconductor compound and a non-liquid-crystalline organic compound to form a liquid crystalline organic semiconductor mixture and orienting molecules of the liquid crystalline organic semiconductor mixture to cause molecules of the organic semiconductor compound to be oriented.

The aforementioned liquid crystalline organic semiconductor mixture is a liquid crystalline organic semiconductor mixture in which the aforementioned organic semiconductor compound and the aforementioned organic compound are hydrogen-bonded to each other.

One of the aforementioned organic semiconductor compound and the aforementioned organic compound is a compound having at least one element selected from nitrogen, oxygen, sulfur and halogen and the element selected is hydrogen-bonded to hydrogen.

The one of the aforementioned organic semiconductor compound and the aforementioned organic compound which has at least the aforementioned element selected is a compound further having at least one of an unsaturated bond and a benzene ring.

The aforementioned organic semiconductor compound is a derivative comprising an organic semiconductor compound of at least any one of an acene type, a phthalocyanine type and a thiophene type.

The derivative comprising an organic semiconductor compound of the aforementioned acene type is a pentacene derivative.

The derivative comprising an organic semiconductor compound of the aforementioned phthalocyanine type is a copper phthalocyanine derivative.

The conductive thin film is formed by orienting molecules of the aforementioned liquid crystalline organic semiconductor mixture to cause molecules of the aforementioned organic semiconductor compound to be oriented and then removing the aforementioned organic compound from the aforementioned liquid crystalline organic semiconductor mixture.

The conductive thin film is formed by removing the aforementioned organic compound from the aforementioned liquid crystalline organic semiconductor mixture by at least one of heating and ultraviolet irradiation.

The conductive thin film is formed by mixing at least an organic semiconductor compound having a first liquid crystalline phase in which crystallization temperature allowing crystallization from the liquid crystalline phase to occur is not lower than room temperature and an organic compound exhibiting a second liquid crystalline phase of a lower orientational order than the first liquid crystalline phase within a temperature range that is higher than the crystallization temperature of the organic semiconductor compound to form a mixed composition and orienting the mixed composition in the second liquid crystalline phase exhibited within a predetermined temperature range to cause molecules of the organic semiconductor compound to be oriented.

The aforementioned first liquid crystalline phase is a smectic liquid crystalline phase, while the aforementioned second liquid crystalline phase is a nematic liquid crystalline phase.

The aforementioned organic semiconductor compound is an organic semiconductor compound comprising a low polymer organic semiconductor compound.

The aforementioned mixed composition is a mixed composition containing 70 to 98 wt % of the aforementioned organic semiconductor compound.

The aforementioned mixed composition is a mixed composition containing 90 to 95 wt % of the aforementioned organic semiconductor compound.

The aforementioned organic semiconductor compound is an organic semiconductor compound comprising an oligothiophene derivative.

The present invention also provides a method of fabricating a conductive thin film, comprising: mixing a first material having electric conductivity or semiconductivity and a second material to prepare a mixture; and orienting the mixture by utilizing liquid crystallinity thereof.

The method of fabricating a conductive thin film comprises: mixing at least nanotube comprising at least one of metallic nanotube and semiconductive nanotube and a liquid crystalline organic compound together; and orienting molecules of the liquid crystalline organic compound to cause molecules of the nanotube to be oriented.

Carbon nanotube is used as the aforementioned nanotube.

A liquid crystalline organic compound having at least one of a nematic liquid crystalline phase and a smectic liquid crystalline phase is used as the aforementioned liquid crystalline organic compound.

A liquid crystalline organic compound having a charge transport function is used as the aforementioned liquid crystalline organic compound.

A liquid crystalline organic compound having at least 16π-electron aromatic rings, m 10π-electron aromatic rings or n 14π-electron aromatic rings (wherein l+m+n=1 to 4; and l and n are each an integer from 0 to 4) is used as the aforementioned liquid crystalline organic compound.

A liquid crystalline organic compound having at least any one of a 2-phenylnaphthalene ring, a biphenyl ring, a benzothiazole ring and a t-thiophene ring and a substantially rod-like molecular structure is used as the aforementioned liquid crystalline organic compound.

The method of fabricating a conductive thin film comprises: mixing at least a non-liquid-crystalline organic semiconductor compound and a non-liquid-crystalline organic compound to form a liquid crystalline organic semiconductor mixture; and orienting molecules of the liquid crystalline organic semiconductor mixture to cause molecules of the organic semiconductor compound to be oriented.

A liquid crystalline organic semiconductor mixture in which the aforementioned organic semiconductor compound and the aforementioned organic compound are hydrogen-bonded to each other is used as the aforementioned liquid crystalline organic semiconductor mixture.

A compound having at least one element selected from nitrogen, oxygen, sulfur and halogen is used as one of the aforementioned organic semiconductor compound and the aforementioned organic compound and the element selected is hydrogen-bonded to hydrogen.

A compound further having one of an unsaturated bond and a benzene ring is used as the one of the aforementioned organic semiconductor compound and the aforementioned organic compound which has at least the aforementioned element selected.

A derivative comprising an organic semiconductor compound of at least any one of an acene type, a phthalocyanine type and a thiophene type is used as the aforementioned organic semiconductor compound.

A pentacene derivative is used as the derivative comprising an organic semiconductor compound of the aforementioned acene type.

A copper phthalocyanine derivative is used as the derivative comprising an organic semiconductor compound of the aforementioned phthalocyanine type.

The method of fabricating a conductive thin film comprises: orienting molecules of the aforementioned liquid crystalline organic semiconductor mixture to cause molecules of the aforementioned organic semiconductor compound to be oriented; and then removing the aforementioned organic compound from the aforementioned liquid crystalline organic semiconductor mixture.

The method of fabricating a conductive thin film comprises removing the aforementioned organic compound from the aforementioned liquid crystalline organic semiconductor mixture by at least one of heating and ultraviolet irradiation.

The method of fabricating a conductive thin film comprises: mixing at least an organic semiconductor compound having a first liquid crystalline phase in which crystallization temperature allowing crystallization from the liquid crystalline phase to occur is not lower than room temperature and an organic compound exhibiting a second liquid crystalline phase of a lower orientational order than the first liquid crystalline phase within a temperature range that is higher than the crystallization temperature of the organic semiconductor compound to form a mixed composition; and orienting the mixed composition in the second liquid crystalline phase exhibited within a predetermined temperature range to cause molecules of the organic semiconductor compound to be oriented.

A smectic liquid crystalline phase is used as the aforementioned first liquid crystalline phase and a nematic liquid crystalline phase is used as the aforementioned second liquid crystalline phase.

An organic semiconductor compound comprising a low polymer organic semiconductor compound is used as the aforementioned organic semiconductor compound.

A mixed composition containing 70 to 98 wt % of the aforementioned organic semiconductor compound is used as the aforementioned mixed composition.

A mixed composition containing 90 to 95 wt % of the aforementioned organic semiconductor compound is used as the aforementioned mixed composition.

An organic semiconductor compound comprising an oligothiophene derivative is used as the aforementioned organic semiconductor compound.

The present invention also provides a thin film transistor comprising a conductive thin film as recited in claim 1 as a semiconductor layer forming a channel layer.

The aforementioned conductive thin film is a conductive thin film formed by mixing at least nanotube comprising at least one of metallic nanotube and semiconductive nanotube and a liquid crystalline organic compound together and orienting molecules of the liquid crystalline organic compound to cause molecules of the nanotube to be oriented.

The aforementioned conductive thin film is a conductive thin film formed by mixing at least a non-liquid-crystalline organic semiconductor compound and a non-liquid-crystalline organic compound to form a liquid crystalline organic semiconductor mixture and orienting molecules of the liquid crystalline organic semiconductor mixture to cause molecules of the organic semiconductor compound to be oriented.

The aforementioned conductive thin film is a conductive thin film formed by mixing at least an organic semiconductor compound having a first liquid crystalline phase in which crystallization temperature allowing crystallization from the liquid crystalline phase to occur is not lower than room temperature and an organic compound exhibiting a second liquid crystalline phase of a lower orientational order than the first liquid crystalline phase within a temperature range that is higher than the crystallization temperature of the organic semiconductor compound to form a mixed composition and orienting the mixed composition in the second liquid crystalline phase exhibited within a predetermined temperature range to cause molecules of the organic semiconductor compound to be oriented.

The present invention also provides a method of fabricating a thin film transistor, comprising a method of fabricating a conductive thin film as recited in claim 23 as a method of fabricating a conductive thin film serving as a semiconductor layer forming a channel layer.

The aforementioned method of fabricating a conductive thin film comprises the steps of: mixing at least nanotube comprising at least one of metallic nanotube and semiconductive nanotube and a liquid crystalline organic compound together; and orienting molecules of the liquid crystalline organic compound to cause molecules of the nanotube to be oriented.

The aforementioned method of fabricating a conductive thin film comprises the steps of mixing at least a non-liquid-crystalline organic semiconductor compound and a non-liquid-crystalline organic compound to form a liquid crystalline organic semiconductor mixture; and orienting molecules of the liquid crystalline organic semiconductor mixture to cause molecules of the organic semiconductor compound to be oriented.

The aforementioned method of fabricating a conductive thin film comprises the steps of: mixing at least an organic semiconductor compound having a first liquid crystalline phase in which crystallization temperature allowing crystallization from the liquid crystalline phase to occur is not lower than room temperature and an organic compound exhibiting a second liquid crystalline phase of a lower orientational order than the first liquid crystalline phase within a temperature range that is higher than the crystallization temperature of the organic semiconductor compound to form a mixed composition; and orienting the mixed composition in the second liquid crystalline phase exhibited within a predetermined temperature range to cause molecules of the organic semiconductor compound to be oriented.

The present invention also provides an image display device comprising a conductive thin film as recited in claim 1 as at least one of a conductive layer and a semiconductor layer forming a channel layer of a thin film transistor.

The aforementioned conductive thin film is a conductive thin film formed by mixing at least nanotube comprising at least one of metallic nanotube and semiconductive nanotube and a liquid crystalline organic compound together and orienting molecules of the liquid crystalline organic compound to cause molecules of the nanotube to be oriented.

The aforementioned conductive thin film is a conductive thin film formed by mixing at least a non-liquid-crystalline organic semiconductor compound and a non-liquid-crystalline organic compound to form a liquid crystalline organic semiconductor mixture and orienting molecules of the liquid crystalline organic semiconductor mixture to cause molecules of the organic semiconductor compound to be oriented.

The aforementioned conductive thin film is a conductive thin film formed by mixing at least an organic semiconductor compound having a first liquid crystalline phase in which crystallization temperature allowing crystallization from the liquid crystalline phase to occur is not lower than room temperature and an organic compound exhibiting a second liquid crystalline phase of a lower orientational order than the first liquid crystalline phase within a temperature range that is higher than the crystallization temperature of the organic semiconductor compound to form a mixed composition and orienting the mixed composition in the second liquid crystalline phase exhibited within a predetermined temperature range to cause molecules of the organic semiconductor compound to be oriented.

The present invention also provides an electronic device comprising a conductive thin film as recited in claim 1 as at least one of a conductive layer and a semiconductor layer forming a channel layer of a thin film transistor.

The aforementioned conductive thin film is a conductive thin film formed by mixing at least nanotube comprising at least one of metallic nanotube and semiconductive nanotube and a liquid crystalline organic compound together and orienting molecules of the liquid crystalline organic compound to cause molecules of the nanotube to be oriented.

The aforementioned conductive thin film is a conductive thin film formed by mixing at least a non-liquid-crystalline organic semiconductor compound and a non-liquid-crystalline organic compound to form a liquid crystalline organic semiconductor mixture and orienting molecules of the liquid crystalline organic semiconductor mixture to cause molecules of the organic semiconductor compound to be oriented.

The aforementioned conductive thin film is a conductive thin film formed by mixing at least an organic semiconductor compound having a first liquid crystalline phase in which crystallization temperature allowing crystallization from the liquid crystalline phase to occur is not lower than room temperature and an organic compound exhibiting a second liquid crystalline phase of a lower orientational order than the first liquid crystalline phase within a temperature range that is higher than the crystallization temperature of the organic semiconductor compound to form a mixed composition and orienting the mixed composition in the second liquid crystalline phase exhibited within a predetermined temperature range to cause molecules of the organic semiconductor compound to be oriented.

Advantages of Invention

The present invention, which is practiced by the above-described solution means, is capable of providing an inexpensive and flexible conductive thin film having excellent carrier mobility and electric conductivity which is formed by highly orienting nanotube or an electronic functional organic material by simple and convenient means, as well as a thin film transistor employing such a conductive film.

According to the embodiment wherein the conductive thin film is formed by using the composite-type material comprising a mixture of nanotube and the liquid crystalline organic compound, since the nanotube is highly oriented by utilizing a high degree of orientation of the liquid crystalline organic compound, the conductive thin film having excellent carrier mobility and electric conductivity and the thin film transistor employing the conductive thin film can be fabricated by a simple and convenient method.

According to the embodiment wherein the conductive thin film is formed from the liquid crystalline electronic functional organic material comprising the non-liquid-crystalline electronic functional organic material and the non-liquid-crystalline organic compound which are hydrogen-bonded to each other, since the liquid crystalline electronic functional organic material is highly oriented by utilizing the conventional orientation technique, the conductive thin film having excellent carrier mobility and electric conductivity and the thin film transistor employing the conductive thin film can be fabricated by a simple and convenient method.

According to the embodiment wherein the aforementioned liquid crystalline electronic functional organic material is used, since the non-liquid-crystalline organic compound can be removed by cutting off the hydrogen bond after having highly oriented the liquid crystalline electronic functional organic material, the conductive thin film exhibiting a sufficiently high carrier mobility which inherent to the electronic functional organic material and the thin film conductive film employing the conductive thin film can be fabricated by a simple and convenient method.

According to the embodiment wherein the conductive thin film is formed from the mixed composition comprising a mixture of the electronic functional organic material having the first liquid crystalline phase which has a high order at a high temperature or a potentially high order and the organic compound exhibiting the second liquid crystalline phase of a low order, since the second liquid crystalline phase of a low order is exhibited to cause the electronic functional organic material to be oriented in a predetermined direction, the conductive thin film having excellent carrier mobility and electric conductivity and the thin film transistor employing the conductive thin film can be fabricated by a simple and convenient method.

By practicing the present invention, it becomes possible to provide an inexpensive and flexible conductive thin film having excellent carrier mobility and electric conductivity as well as a thin film transistor employing such a conductive film. Accordingly, it becomes possible to provide a high-performance and high-definition image display device of a low price, a microminiature semiconductor circuit, and a microelectronic device.

DESCRIPTION OF REFERENCE NUMERALS

Figure 1A:
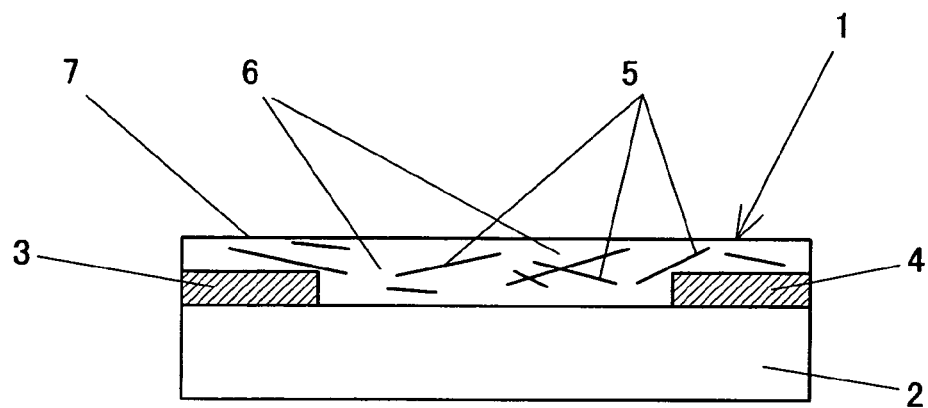
FIG. 1 is a sectional view schematically illustrating a part of a process for forming a conductive thin film according to embodiment 1 of the present invention.

1 . . . conductive thin film
2 . . . substrate
3,4 . . . electrode
5 . . . carbon nanotube
6 . . . liquid crystalline organic compound
7 . . . composite-type compound
8 . . . roll coater
9 . . . gate insulator
10 . . . semiconductor layer
11 . . . source electrode
12 . . . drain electrode
13 . . . carbon nanotube
14 . . . composite-type compound
15 . . . composite-type semiconductor layer
16 . . . liquid crystalline organic semiconductor compound
17 . . . gate electrode
18a,18b . . . thin film transistor
19 . . . image display device
20 . . . plastic substrate
21,22 . . . electrode
23 . . . intersection
24a,24b . . . driver circuit
25 . . . control device
26 . . . liquid crystalline organic semiconductor compound
28 . . . conductive thin film
29 . . . conductive thin film
30 . . . thin film transistor
31 . . . semiconductor layer
32 . . . dropping nozzle
33 . . . mixed composition layer
34 . . . nematic phase
35 . . . conductive thin film
36 . . . semiconductor layer
37 . . . thin film transistor
38 . . . mixed composition layer
39 . . . nematic phase
100 . . . thin film transistor
101 . . . insulating substrate
102 . . . gate insulator
103 . . . gate electrode
104 . . . source electrode
105 . . . drain electrode
106 . . . organic semiconductor layer
200 . . . thin film transistor
201 . . . $p^+$ silicon substrate
202 . . . gate insulator
203 . . . semiconductor layer
204 . . . source electrode
205 . . . drain electrode
206,207 . . . contact section

BEST MODE FOR CARRYING OUT THE INVENTION

Hereinafter, the best mode for carrying out the present invention will be described in detail with reference to the drawings. Throughout the drawings to be referred to in the following description, like numerals designate like parts or components. In the present invention, the term "conductive thin film" is meant to include both a thin film conductor to form an electrode, wiring or the like and a thin film semiconductor to form a thin film transistor or an organic electroluminescent device.

Embodiment 1

Embodiments 1 to 3 of the present invention to be described below are embodiments each realizing a conductive thin film which is further improved in electric conductivity and carrier mobility and which is formed by preparing a composite-type material by mixing carbon nanotube as a conductor or semiconductor material and a liquid crystalline organic compound together and aligning molecules of the carbon nanotube favorably and densely by utilizing favorable orientation of the liquid crystalline organic compound of the composite-type material, as well as a thin film transistor employing such a conductive thin film.

FIG. 1 is a sectional view schematically illustrating a part of a process for forming a conductive thin film according to embodiment 1 of the present invention.

The conductive thin film 1 shown in FIG. 1 is formed in the following manner. In FIG. 1(a), two electrodes 3 and 4 of such a material as gold are disposed opposite to each other across a spacing of about 5 μm on a flexible substrate 2 comprising a thin glass sheet, a plastic substrate or the like. A composite-type compound 7 prepared by mixing metallic carbon nanotube 5 to be described later and a liquid crystalline organic compound 6 is coated so as to cover the opposite electrodes 3 and 4 and the substrate 2 or cover at least the aforementioned spacing, with the liquid crystalline organic compound 6 in the composite-type compound 7 kept in an isotropic phase condition. At this time, molecules of the metallic carbon nanotube 5 are randomly and sparsely positioned among molecules of the liquid crystalline organic compound 6 in the isotropic phase, as shown in FIG. 1(a).

In the present embodiment, the metallic carbon nanotube 5 comprises, for example, a carbon nanotube having a high electric conductivity of $(1 \text{ to } 5) \times 10^3 \Omega^{-1} \text{cm}^{-1}$ and a diameter of 1 to 10 nm and a length of 1 to 5 μm. The carbon nanotube to be used is not limited to carbon nanotube having the above-noted electrical characteristic and shape but may have a shape and an electrical characteristic whether within or out of the aforementioned ranges.

Figure 6:
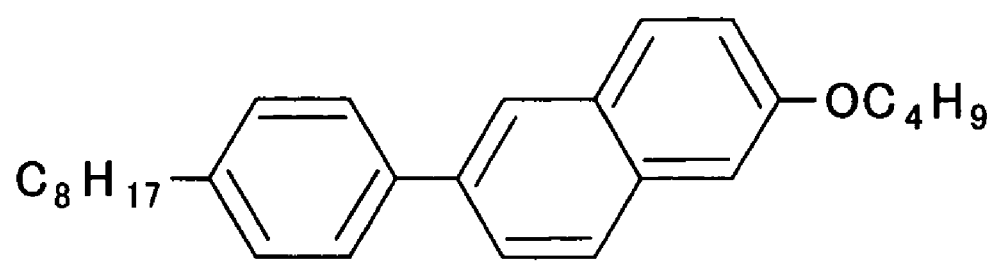
FIG. 6 is a structural diagram showing the structure of 8-PNP—$O_4$, which is a molecular compound of a 2-phenyl-naphthalene derivative.

In the present embodiment, the liquid crystalline organic compound 6 used is 8-PNP—$O_4$, which is a molecular compound of a 2-phenylnaphthalene derivative and which has a structure shown in FIG. 6. The molecular compound 8-PNP—$O_4$ is used in a smectic phase, either SmA phase or SmE phase, among liquid crystalline phases thereof. Note that the compound 8-PNP—$O_4$ exhibits an isotropic phase at a temperature not lower than 129° C., SmA phase at a temperature between 125° C. and 129° C., and SmE phase at a temperature between 55° C. and 125° C.

Figure 1B:
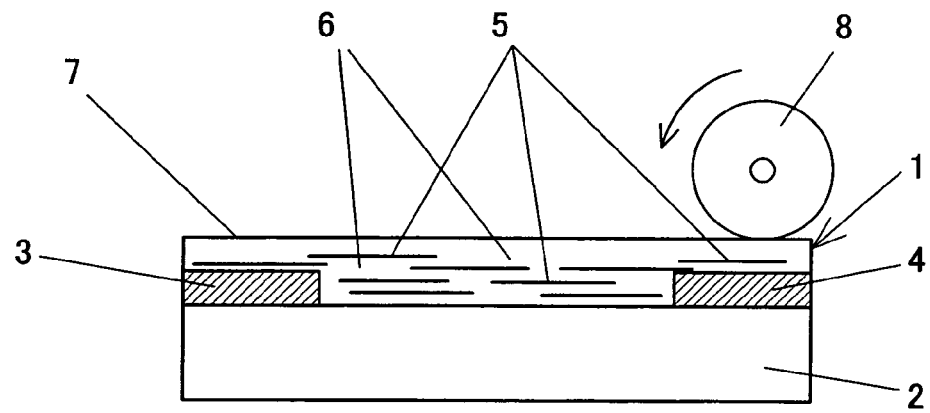

Subsequently, in the condition shown in FIG. 1(b), the coat of the composite-type compound 7 with the liquid crystalline organic compound 6 kept in the isotropic phase is gradually cooled to hold the liquid crystalline organic compound 6 in SmA or SmE phase. Among smectic phases, the SmA phase and the SmE phase each have such a high degree of molecular orientational order as can be regarded as a flexible crystal. After coating of the composite-type compound 7, the layer of the composite-type compound 7 is applied with a shear stress in a substantially fixed direction by means of a roll coater 8 or the like, as shown in FIG. 1(b). Then, 8-PNP—$O_4$ molecules of the liquid crystalline organic compound 6 in SmA or SmE phase as a smectic phase having a high degree of molecular orientational order are favorably and homogeneously oriented. Thus, along the favorably oriented 8-PNP—$O_4$ molecules, the metallic carbon nanotube 5 mixed therewith becomes oriented favorably in the composite-type compound 7. In this way, the conductive thin film 1 is formed by such a simple and convenient method as to align and orient carbon nanotubes 5 densely in the degree of molecular orientational order improved by utilizing the liquid crystallinity of the liquid crystalline organic compound 6. Thus, it becomes possible to align the molecules of the metallic carbon nantotube 5 in substantially one alignment direction. By more densely aligning carbon nanotubes 5 having an improved fill density in the mixture, the density of electronic contacts between adjacent molecules of the carbon nanotube 5 can be increased.

According the result of an experiment, the conductive thin film 1, which was formed by the above-described method to comprise the composite-type compound 7 prepared by mixing the metallic carbon nanotube 5 and the liquid crystalline organic compound 6 and have an improved degree of molecular orientational order as compared with the prior art, had a very high electric conductivity as high as about $5 \times 10^2 \Omega^{-1} \text{cm}^{-1}$. In contrast, a conductive thin film having a lower degree of orientation of carbon nanotube, which was formed by the prior art to comprise a similar composite-type compound prepared by using similar carbon nanotube, had a low electric conductivity as low as about $10 \Omega^{-1} \text{cm}^{-1}$.

As described above, the conductive thin film according to the present invention can have an improved fill density of carbon nanotube by orienting molecules of the liquid crystalline organic compound of the composite-type compound in a predetermined direction to causes carbon nanotube molecules mixed in the composite-type compound to be aligned favorably and densely. For this reason, the density of electronic contacts between adjacent carbon nanotube molecules can be increased, which makes it possible to improve the electric conductivity of the conductive thin film by leaps and bounds. The use of a conductive thin film of such a structure makes it possible to provide an organic-type conductive thin film which is excellent in characteristics and adaptable to a low-temperature process for realizing components for use in microcircuit devices, high-performance electronic devices and the like or wiring materials.

While the present embodiment described above utilizes a smectic phase, either SmA phase or SmE phase, of the 2-phenylnaphthalene derivative used as the liquid crystalline organic compound, the present invention can be practiced by using such a liquid crystalline phase as SmB phase without limitation to this embodiment.

While the present embodiment described above uses 8-PNP—$O_4$, which is a 2-phenylnaphthalene derivative, as the liquid crystalline organic compound, it is possible to use a smectic phase, either SmA phase or SmB phase, of 8-PNP—$O_{12}$ or a nematic phase of 5-PNP—$O_1$ without limitation to this embodiment.

While the present embodiment described above uses a 2-phenylnaphthalene derivative as the liquid crystalline organic compound, any liquid crystalline organic compound may be used without limitation to this embodiment as long as the liquid crystalline organic compound has a nematic or smectic phase having a high degree of molecular orientational order.

Further, while the present embodiment described above uses metallic carbon nanotube as nanotube, it is possible to use, for example, nanotube admixed with semiconductive nanotube without limitation to this embodiment.

Embodiment 2

Figure 2:
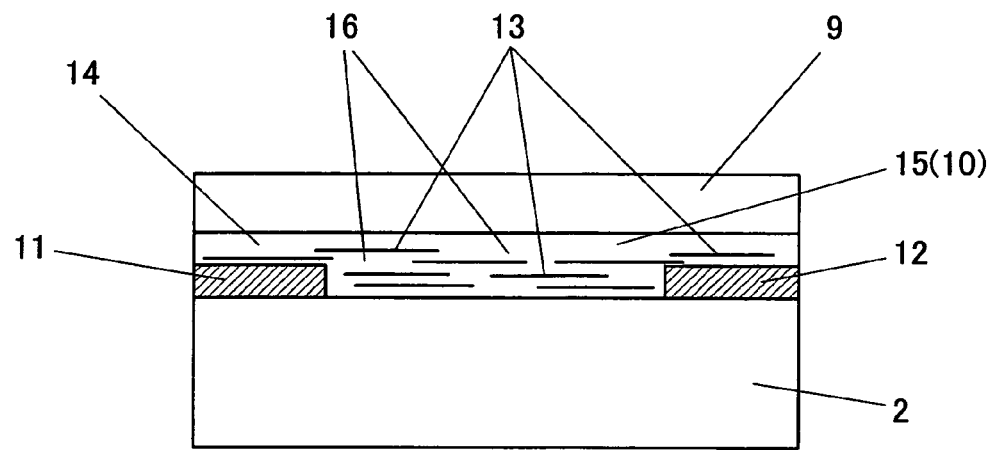
FIG. 2 is a sectional view schematically illustrating a part of a process for forming a composite-type semiconductor layer in which a conductive thin film according to embodiment 2 of the present invention is used as a semiconductor layer.

FIG. 2 is a sectional view schematically illustrating a part of a process for forming a composite-type semiconductor layer in which a conductive thin film according to embodiment 2 of the present invention is used as a semiconductor layer.

The composite-type semiconductor layer 15 as the semiconductor layer 10 in FIG. 2 is formed in the following manner. An orientation film (not shown), such as a polyimide film or a monomolecular film, is formed over a surface of a region in which at least a channel (not shown) is to be formed so as to cover at least a part of each of source and drain electrodes 11 and 12 disposed opposite to each other on a substrate 2 and an upper surface of the substrate 2 lying in the space intervening between these electrodes. The orientation film is then oriented in a predetermined direction by such orientation means as rubbing. Thereafter, a composite-type compound 14 prepared by mixing semiconductive carbon nanotube 13 and a liquid crystalline organic semiconductor compound 16 is coated to the substrate 2. Alternatively, the composite-type compound 14 is injected into a region defined between the substrate 2 including the source and drain electrodes 11 and 12 and the gate insulator 9 extending above the liquid crystalline organic semiconductor compound 16.

In the present embodiment, the semiconductive carbon nanotube 13 comprises, for example, a carbon nanotube having a carrier mobility of about 1000 $cm^2$/Vs, a diameter of 1 to 5 nm and a length of about 1 μm. Such semiconductive carbon nanotubes 13 are selected from mixed-type carbon nanotube comprising metallic carbon nanotubes and semiconductive carbon nanotubes. As in embodiment 1, the liquid crystalline organic compound 16 used is 8-PNP—$O_4$, which is a 2-phenylnaphthalene derivative shown in FIG. 6. The compound 16 is used in a smectic phase, either SmA phase or SmE phase, among liquid crystalline phases thereof.

After coating of the composite-type compound 14 prepared by mixing the liquid crystalline organic semiconductor compound 16 in an isotropic phase and semiconductive carbon nanotube 13 on the substrate 2, the temperature of the composite-type compound 7 is lowered to hold the liquid crystalline organic semiconductor compound 16 in SmA or SmE phase.

In the present embodiment, since the orientation film (not shown) formed on at least the substrate 2 is oriented in the predetermined direction by such orientation means as rubbing, molecules of 8-PNP—$O_4$ as the liquid crystalline organic semiconductor compound 16 held in SmA or SmE phase as a smectic phase having an excellent degree of molecular orientational order are oriented favorably. Such favorable orientation of 8-PNP—$O_4$ molecules causes semiconductive carbon nanotubes 13 to be aligned so densely as to improve the degree of molecular orientational order thereof. In this way, the composite-type semiconductor layer 15 is advantageously formed as the semiconductor layer 10.

In the present embodiment in particular, the liquid crystalline organic semiconductor compound 16 comprises a compound having a charge transport function. Specifically, the liquid crystalline organic semiconductor compound 16 comprising 8-PNP—$O_4$ in SmE phase shown in FIG. 6 has, per se, a carrier mobility of $10^{-2}$ $cm^2$/Vs with respect to electron and hole both. This value of carrier mobility is comparable to that of a-Si:H with respect to hole and is close to the maximum carrier mobility value of organic compounds except molecular crystals with respect to electron. In the composite-type semiconductor film 15 thus formed, the liquid crystalline organic semiconductor compound 16 is favorably oriented while at the same time carbon nanotubes 13 aligned so favorably and densely as to improve the fill density thereof in the mixture. Accordingly, the density of electronic contacts between adjacent carbon nanotube molecules can be increased.

According the result of an experiment, the composite-type semiconductor layer 15 as the semiconductor layer 10, which was formed by the above-described method using the composite-type compound 14 prepared by mixing the metallic carbon nanotube 13 and the liquid crystalline organic compound 16 and which had an improved degree of molecular orientational order as compared with the prior art by a simple and convenient method, had a high carrier mobility as high as about 350 $cm^2$/Vs. In contrast, a composite-type semiconductor layer having a lower degree of molecular orientational order, which was formed by the prior art using a conventional composite-type semiconductor material prepared by using semiconductive carbon nanotube having similar characteristics to the carbon nanotube 13, had a low carrier mobility as low as about 0.6 $cm^2$/Vs.

Embodiment 3

Figure 3:
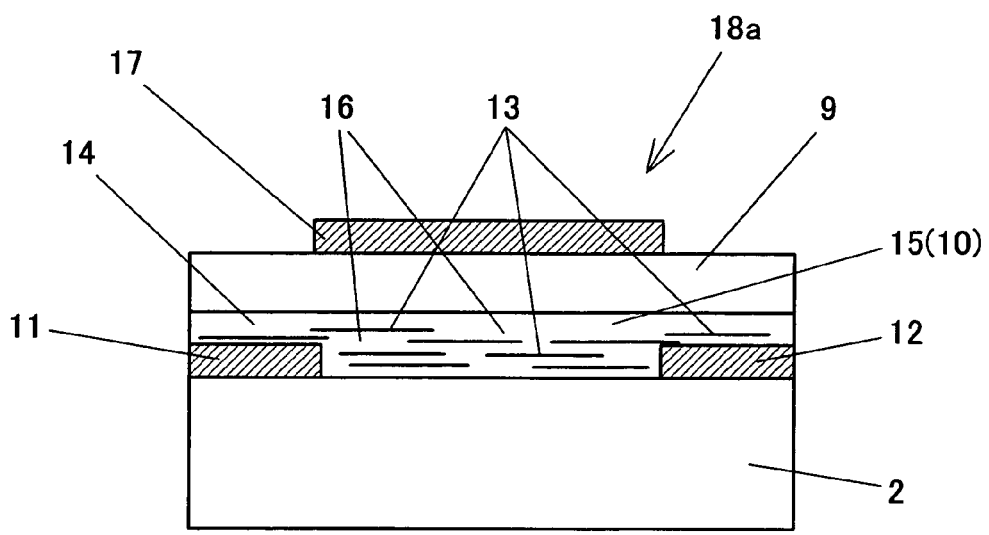
FIG. 3 is a sectional view schematically showing the construction of a thin film transistor according to embodiment 3 of the present invention.

FIG. 3 is a sectional view schematically showing the construction of a thin film transistor according to embodiment 3 of the present invention.

As shown in FIG. 3, the thin film transistor 18a according to the present embodiment has source and drain electrodes 11 and 12 formed on a substrate 2 by patterning such an electrode material as gold. The thin film transistor 18a also has a composite-type semiconductor layer 15 formed as semiconductor layer 10 by a method to be described later, the composite-type semiconductor layer 15 being interposed between the source and drain electrodes 11 and 12 and a gate insulator 9 to be described later. Over an upper surface of the composite-type semiconductor layer 15 is formed the gate insulator 9 comprising silicon oxide, a polyvinylidene fluoride organic compound or the like. The thin film transistor 18a further has a gate electrode 17 formed of such an electrode material as gold on the upper side of the gate insulator 9. The source and drain electrodes 11 and 12, gate insulator 9 and gate electrode 17 are sequentially patterned by utilizing a thin film deposition technique, photolithography, lift-off technique and the like. In this way, the thin film transistor 18a of the top-gated type having the gate electrode 17 disposed on top is constructed as shown in FIG. 3. For convenience, such components as a cap layer and a sealing film for sealing the semiconductor layer 10 are not illustrated in FIG. 3.

The composite-type semiconductor layer 15 as the semiconductor layer 10 in FIG. 3 is formed in the following manner. An orientation film (not shown), such as a polyimide film or a monomolecular film, is formed over a surface of a region in which at least a channel (not shown) is to be formed so as to cover at least a part of each of source and drain electrodes 11 and 12 disposed opposite to each other on the substrate 2 and an upper surface of the substrate 2 lying in the space intervening between these electrodes. The orientation film is then oriented in a predetermined direction by such orientation means as rubbing. Thereafter, a composite-type compound 14 prepared by mixing semiconductive carbon nanotube 13 and a liquid crystalline organic semiconductor compound 16 is coated over the source and drain electrodes 11 and 12 and the substrate 2. With the channel (not shown) of the thin film transistor 18a centered between the source and drain electrodes 11 and 12, the gate insulator 9 is formed over the semiconductor layer 10. The composite-type compound 14 may be injected between the substrate 2 and the gate insulator 9.

In the present embodiment, the semiconductive carbon nanotube 13 comprised, for example, semiconductive carbon nanotube having a carrier mobility of about 1000 $cm^2/Vs$, a diameter of 1 to 5 nm and a length of about 1 μm which was selected from mixed carbon nanotube comprising metallic carbon nanotubes and semiconductive carbon nanotubes.

As in embodiment 1, the liquid crystalline organic semiconductor compound 16 used in this embodiment is 8-PNP—$O_4$, which is a molecular compound of a 2-phenylnaphthalene derivative having the structure shown in FIG. 6. The compound 16 is used in a smectic phase, either SmA phase or SmE phase, among liquid crystalline phases thereof. Note that the compound 8-PNP—$O_4$ exhibits an isotropic phase at a temperature not lower than 129° C., SmA phase at a temperature between 125° C. and 129° C., and SmE phase at a temperature between 55° C. and 125° C.

In the present embodiment, the composite-type compound 14 is prepared by mixing the liquid crystalline organic semiconductor compound 16 in an isotropic phase and semiconductive carbon nanotube 13 together and coated to the substrate 2. By lowering the temperature of the composite-type compound 14 thus coated, the liquid crystalline organic compound 16 is held in SmA or SmE phase.

Among smectic phases, SmA phase or SmE phase has such a high degree of molecular orientational order as can be regarded as a flexible crystal. In the present embodiment, since the orientation film (not shown) formed on at least the substrate 2 is oriented in the predetermined direction by such orientation means as rubbing, molecules of 8-PNP—$O_4$ used as the liquid crystalline organic semiconductor compound 16 in SmA or SmE phase as a smectic phase having an excellent degree of molecular orientational order are oriented favorably. Such favorable orientation of 8-PNP—$O_4$ molecules causes semiconductive carbon nanotubes 13 mixed with 8-PNP—$O_4$ to be aligned so densely and favorably as to improve the degree of molecular orientational order thereof. In the composite-type semiconductor film 15 thus formed, the liquid crystalline organic semiconductor compound 16 having the charge transport function is favorably oriented while at the same time semiconductive carbon nanotubes 13 aligned so favorably and densely as to improve the fill density thereof in the mixture. Accordingly, the density of electronic contacts between adjacent carbon nanotube molecules can be increased, whereby the composite-type semiconductor layer 15 can be used as favorable semiconductor layer 10. That is, the composite-type semiconductor layer 15 is advantageously formed as the semiconductor layer 10.

According the result of an experiment, in the thin film transistor 18a having the composite-type semiconductor layer 15 formed by the above-described method, the composite-type semiconductor layer 15 as the semiconductor layer 10, which comprised the composite-type compound 14 prepared by mixing the carbon nanotube 13 and the liquid crystalline organic semiconductor compound 16 together and had a degree of molecular orientational order that was improved as compared with the prior art by a simple and convenient method, had a high carrier mobility as high as about 350 $cm^2/Vs$. In contrast, a thin film transistor having a composite-type semiconductor layer having a lower degree of molecular orientational order, which was formed by the prior art to comprise a conventional composite-type semiconductor material prepared by using semiconductive carbon nanotube having similar characteristics to the carbon nanotube 13, had a low carrier mobility at channel as low as about 0.6 $cm^2/Vs$.

According to the present embodiment, since the composite-type semiconductor layer 15 comprises the composite-type compound 14, it is possible to orient molecules of the liquid crystalline organic semiconductor compound 16 as well as to align semiconductive carbon nanotubes 13 mixed therewith favorably and densely in accordance with the orientation of the liquid crystalline organic semiconductor compound 16 in the composite-type semiconductor layer 15. Also, since the conventional orientation means can be employed as means for orienting the liquid crystalline organic semiconductor compound 16, the carbon nanotube 13 can be oriented by a simple and convenient method. Such a simple and convenient method makes it possible to improve the fill density of carbon nanotube 13 and increase the density of electronic contacts between adjacent carbon nanotube molecules. For this reason, it becomes possible to provide the thin film transistor 18a having the semiconductor layer 10 which is improved in carrier mobility at a low price. Further, since the semiconductor layer 10 can be improved in carrier mobility, the thin film transistor 18a can be used in microcircuit devices, high-performance electronic devices and the like.

According to the present embodiment, which uses the composite-type semiconductor layer 15 composed of the liquid crystalline organic semiconductor compound 16 and the semiconductive carbon nanotube 13, the carrier mobility at channel of the thin film transistor 18a can be further enhanced than in cases where a semiconductor layer comprises a mixture of a liquid crystalline organic compound and carbon nanotube. Specifically, current in the composite-type semiconductor layer 15 passes through the liquid crystalline organic semiconductor compound 16 and the semiconductive carbon nanotube 13. Between closely positioned adjacent molecules of the carbon nanotube 13, current passes through molecules of the liquid crystalline organic semiconductor compound 16 that are present around such carbon nanotube molecules. Accordingly, the use of the liquid crystalline organic semiconductor compound 16 makes it possible to provide the thin film transistor 18a which is more excellent in carrier mobility and on-characteristic than the use of a liquid crystalline organic compound.

Figure 4:
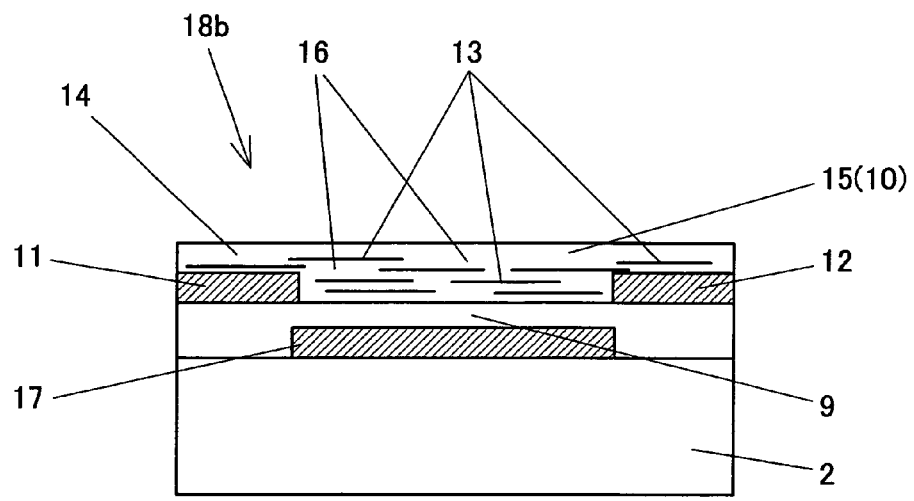
FIG. 4 is a sectional view schematically showing the construction of a bottom-gated thin film transistor having a gate electrode disposed on a substrate or on the bottom according to embodiment 3 of the present invention.

The thin film transistor according to the present embodiment of the invention may be either a top-gated thin film transistor having gate electrode 17 disposed on top of the gate insulator 9 on the opposite side away from the substrate 2 as shown in FIG. 3 or a bottom-gated thin film transistor having gate electrode 17 disposed on the substrate 2 or on the bottom as shown in FIG. 4 showing a different structure from that shown in FIG. 3. Description will be made below of a bottom-gated thin film transistor according to the present embodiment.

FIG. 4 is a sectional view schematically showing the construction of a bottom-gated thin film transistor having a gate electrode disposed on a substrate or on the bottom according to the present embodiment.

As shown in FIG. 4, the bottom-gated thin film transistor 18b has the gate electrode 17 disposed on the upper side of the substrate 2 unlike the top-gated thin film transistor 18a shown in FIG. 3. The gate insulator 9 extends to cover the gate electrode 17 and the exposed portion of the substrate 2. Semiconductor layer 10 and source and drain electrodes 11 and 12 are disposed on the upper side of the gate insulator 9.

In forming the thin film transistor 18b shown in FIG. 4, firstly, the gate electrode 17 is formed on the upper side of the substrate and then the gate insulator 9 formed to extend to cover the gate electrode 17 and the exposed portion of the substrate 2. Subsequently, the source and drain electrodes 11 and 12 are disposed opposite to each other on the upper side of the gate insulator 9. In turn, the composite-type compound 14 comprising a mixture of the semiconductive carbon nanotube 13 and the liquid crystalline organic semiconductor compound 16 is coated to at least the upper side of the gate insulator so as to extend over the pair of opposite source and drain electrodes 11 and 12 or cover the space between the source and drain electrodes 11 and 12. In the case where the liquid crystalline organic semiconductor compound 16 exhibits a smectic phase, the layer of the composite-type compound 14 is applied with a shear stress in a substantially fixed direction by means of a roll coater (not shown) or the like. In the composite-type semiconductor layer 15 thus treated, it becomes possible that molecules of the liquid crystalline organic semiconductor compound 16 are favorably oriented while at the same time semiconductive carbon nanotubes 13 aligned so favorably and densely as to improve the fill density thereof in the mixture. Accordingly, the density of electronic contacts between adjacent carbon nanotube molecules can be increased. By thus forming the composite-type semiconductor layer 15 having a degree of molecular orientational order that is more improved than conventional as the semiconductor layer 10, even the bottom-gated thin film transistor 18b can have improved carrier mobility at channel.

In the fabrication of the thin film transistor 18a or 18b according to the present embodiment, the material usable for the gate electrode 17 and the source and drain electrodes 11 and 12 may be any material which has electric conductivity and is unreactive to each of the substrate 2 and the semiconductor layer 10. Examples of such usable materials include doped silicon, precious metals such as gold, silver, platinum and palladium, alkali metals or alkali earth metals such as lithium, cesium, calcium and magnesium, and metals such as copper, nickel, aluminum, titanium and molybdenum, or alloys thereof. Other usable materials include conductive organic compounds such as polypyrrole, polythiophene, polyaniline and polyphenylenevinylene. Since the thin film transistor 18a or 18b is operable if the gate electrode 17 has a higher electric resistance than other electrodes (source and drain electrodes 11 and 12), the gate electrode 17 in particular may comprise a material different from that of the source and drain electrodes 11 and 12 for easy fabrication. A room-temperature process, which achieves deposition and formation at room temperature or at a temperature close to room temperature, can be applied to but not necessarily required for these electrode materials.

The material usable for the aforementioned gate insulator 9 may be any material which has an electric insulating property and is unreactive to each of the substrate 2, electrodes and the semiconductor layer 10. The substrate 2 and the gate insulator 9 may be in a form wherein a typical silicon oxide film is formed on silicon so as to be used as the gate insulator, or in a form wherein a thin layer of resin or the like is formed after the formation of an oxide film so as to function as the gate insulator. The gate insulator 9 may be formed by deposition of a compound consisting of elements different from those forming the substrate 2 and the electrodes by means of CVD, vapor deposition, sputtering or the like, or by coating, spraying, electrodeposition or the like of a solution of such a compound. Since it is known that a material having a high dielectric constant is used as the material of gate insulator 9 in order to lower the gate voltage of the thin film transistor 18a or 18b, the gate electrode 9 may be formed using a compound having a high dielectric constant other than ferroelectric compounds and ferroelectrics. Besides inorganic materials, it is possible to use organic materials having high dielectric constants such as polyvinylidene fluoride compounds, polyvinylidene cyanide compounds and the like.

While the embodiments 2 and 3 of the present invention each utilize a smectic phase, either SmA phase or SmE phase, of the 2-phenylnaphthalene derivative compound used as the liquid crystalline organic semiconductor compound 16, the present invention may be practiced by utilizing such a liquid crystalline phase as SmB phase. Also, though these embodiments each use 8-PNP—$O_4$, which is a 2-phenylnaphthalene derivative, as the liquid crystalline organic semiconductor compound 16, it is possible to utilize a smectic phase of 8-PNP—$O_{12}$.

While a 2-phenylnaphthalene derivative has been described as an example of the liquid crystalline organic semiconductor compound 16, any liquid crystalline organic semiconductor compound may be used without limitation to that derivative as long as the liquid crystalline organic compound 16 comprises at least one of a nematic liquid crystal compound and a smectic liquid crystal compound each having (l) $6\pi$-electron aromatic rings, (m) $10\pi$-electron aromatic rings and/or (n) $14\pi$-electron aromatic rings (wherein l+m+n=1 to 4 and l and n are each an integer from 0 to 4) in the core, wherein these aromatic rings, same or different, are combined with each other either directly or by a binder through a carbon-carbon double bond or a carbon-carbon triple bond.

Examples of such $6\pi$-electron aromatic rings include benzene ring, pyridine ring, pyrimidine ring, pyridazine ring, pyrazine ring, and tropolone ring. Examples of such $10\pi$-electron aromatic rings include naphthalene ring, azulene ring, benzofuran ring, indole ring, indazole ring, benzothiazole ring, benzoxazole ring, benzimidazole ring, quinoline ring, isoquinoline ring, quinazoline ring, and quinoxaline ring. Examples of such $14\pi$-electron aromatic rings include phenanthrene ring, and anthracene ring. Particularly preferable is a liquid crystalline organic semiconductor compound having at least one of 2-phenylnaphthalene ring, biphenyl ring, benzothiazole ring and t-thiophene ring in the core thereof and a rod-like molecular structure. A more preferable liquid crystalline organic semiconductor compound has 2-phenylnaphthalene ring in the core thereof and benzene ring and naphthalene ring each having an alkyl, alkoxy or a like group as a side chain and a rod-like molecular structure.

The liquid crystalline organic compound or liquid crystalline organic semiconductor compound to be used in practicing the present invention may be any liquid crystalline organic compound or liquid crystalline organic semiconductor compound which has a nematic phase having a higher degree of molecular orientational order or the aforementioned other smectic phase.

In each of embodiments 1 to 3 of the present invention, the liquid crystalline organic compound or liquid crystalline organic semiconductor compound and the nanotube material are mixed together at an adjusted mixture ratio. For example, the mixture ratio of carbon nanotube to the whole mixture is preferably 30 to 90% by volume, desirably 50 to 70% by volume. A conductive thin film, a semiconductor layer and a thin film transistor, each of which is formed using carbon nanotube at that mixture ratio, exhibit more favorable electrical characteristics. Also, in the fabrication process thereof, the mixture prepared at that mixture ratio is easy to handle. The optimum mixture ratio may be appropriately adjusted to the materials used, process conditions and desired characteristics even if the adjusted ratio is out of the aforementioned range.

According to embodiments 1 to 3, a conductive thin film or semiconductor layer having further improved carrier mobility or electric conductivity is formed from a composite-type compound prepared by mixing the liquid crystalline organic compound or liquid crystalline organic semiconductor compound with carbon nanotube, which is an inorganic material. By mixing the liquid crystalline organic semiconductor compound with a carbon nanotube material having high values of carrier mobility and electric conductivity and orienting molecules of these components so favorably as to be rendered composite, it is possible to obtain a layer having a higher carrier mobility than a layer comprising only the liquid crystalline organic semiconductor compound or organic semiconductor compound. This makes it possible to further raise the degree of freedom in designing the channel form or the like of a thin film transistor.

Besides a flexible plastic sheet that can be bent and a thin glass substrate, a resin film substrate having suppleness such as a thin polyimide film may be used as the aforementioned substrate 2. For example, it is possible to use polyethylene film, polystyrene film, polyester film, polycarbonate film, polyimide film and a like film. Such a film can provide for a flexible paper display, sheet display or the like having a substrate comprising a plastic sheet or a resin film.

While carbon nanotube is used as the nanotube in the foregoing description, there is a possibility that novel nanotube comprising carbon or other material will be developed in future. The use of such novel nanotube allows the present invention to be practiced.

The thin film transistors 18a and 18b according to the present invention each have the semiconductor layer 10 comprising the composite-type semiconductor layer 15 composed of at least the liquid crystalline organic semiconductor compound 16 and the carbon nanotube 13 and having an improved degree of orientation. Each of the on-state characteristic value and off-state characteristic value of such a thin film transistor is higher than an intermediate characteristic value between the on- or off-state characteristic value of a conventional thin film transistor having a semiconductor layer comprising only the liquid crystalline organic semiconductor compound 16 and the on- or off-state characteristic value of a conventional thin film transistor having a semiconductor layer comprising only the carbon nanotube 13. For this reason, if one of the on-state characteristic and the off-state characteristic is insufficient, improvement can be made by the present invention. For example, a thin film transistor having a semiconductor layer comprising only the liquid crystalline organic semiconductor compound having a low carrier mobility needs to have a gate width of about several hundred μm, while a thin film transistor having a semiconductor layer comprising only the semiconductive carbon nanotube having a very high carrier mobility needs to have a very small gate width of about 0.1 μm. Either case is not practical. In contrast, the carrier mobility of the composite-type semiconductor layer composed of the liquid crystalline organic semiconductor compound and the carbon nanotube and imparted with a favorable orientation assumes a higher value than the intermediate value between the values of carrier mobility of the two conventional transistors. Therefore, it is possible to make designing and fabrication based on a practical gate width of about several μm and use a long and wide channel region. For this reason, the channel dimensions can be designed to meet the electric conductivities in the on-state and the off-state. That is, the composite-type semiconductor layer of the thin film transistor according to the present invention can be regarded as a composite-type semiconductor layer wherein the advantages of respective of the liquid crystalline organic semiconductor compound and the carbon nanotube are reinforced such that the advantage of the carbon nanotube compensates for the disadvantage of the liquid crystalline organic semiconductor compound while the advantage of the liquid crystalline organic semiconductor compound compensates for the disadvantage of the carbon nanotube.

Next, description will be made of an application of the thin film transistor according to the present invention to a semiconductor device used in an image display device.

Figure 5:
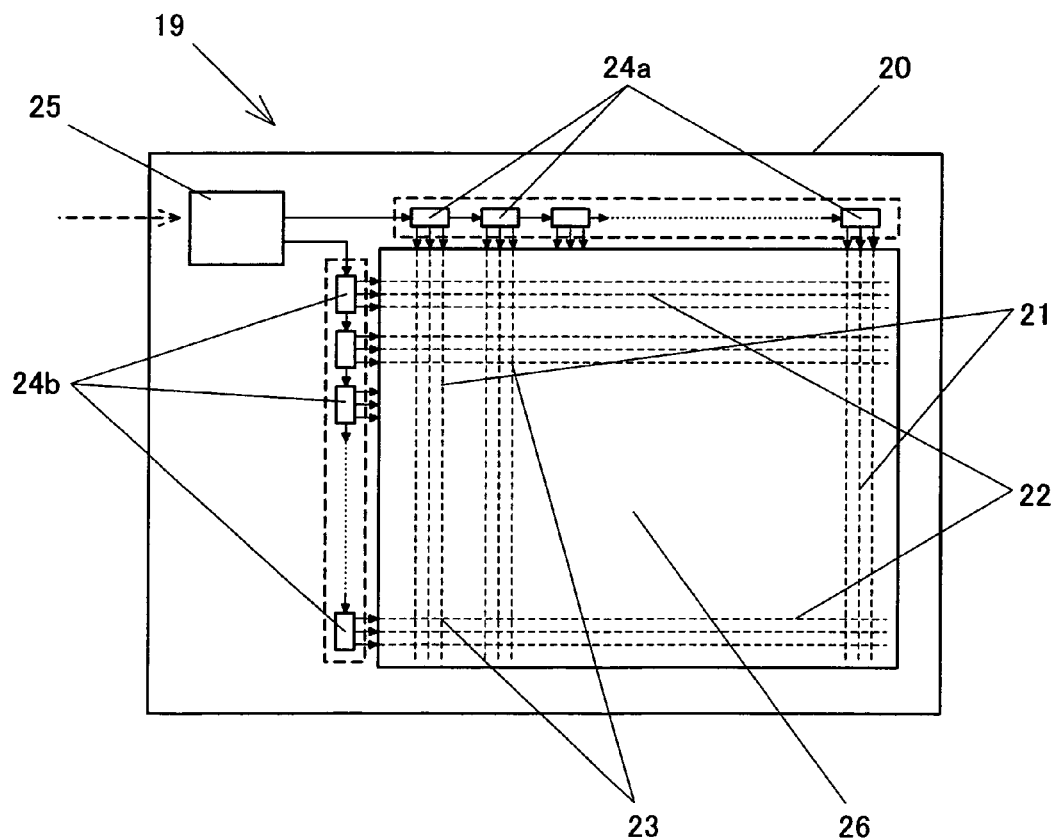
FIG. 5 is a diagram schematically illustrating the configuration of one exemplary image display device using a semiconductor circuit device comprising a thin film transistor according to the present invention.

FIG. 5 is a diagram schematically illustrating the configuration of one exemplary image display device using a semiconductor circuit device comprising a thin film transistor according to the present invention.

In FIG. 5, an active-matrix image display device 19 (display) is constructed using plural thin film transistors (not shown) each having a composite-type semiconductor layer as a semiconductor layer according to embodiment 3 at least as switching devices associated with pixels. The image display device 19 thus constructed is capable of turning ON/OFF an information signal by means of the switching devices (not shown) each located adjacent an associated one of intersections 23 of plural electrodes 21 and plural electrodes 22 arranged in a matrix pattern on a plastic substrate 20 or the like, the switching devices each comprising a very small thin film transistor (not shown). Thus, it becomes possible to construct a rewritable paper-like electronic display or sheet display, which is a high-definition image display device using a supple substrate. If driver circuits 24a and 24b and control circuit 25 (controller), which are located in the periphery of the display, are formed using the aforementioned conductive thin film or thin film transistor (not shown), the display panel 26 and the aforementioned circuits can be formed integrally. For this reason, it is possible to construct a flexible image display device, such as a rewritable paper-like electronic display or a sheet display, which has a more improved mechanical reliability than an image display device using a conductive thin film or thin film transistor comprising only nanotube.

A paper-like or sheet-shaped display panel as the active-matrix display panel can employ display panel types including the liquid crystal display type, organic EL type, electrochromic display type (ECD), electrolytic deposition type, electronic particulate material type, and coherent modulation type (MEMS), and the like.

It is possible to form the aforementioned conductive thin film or thin film transistor integrally with a driver circuit, control circuit or storage circuit of an IC section of microdevice comprising an IC for recording information and an antenna for wireless communication, such as a disposable radio-frequency IC tag (RFID tag). By so doing, it is possible to construct a radio-frequency IC tag which, as a whole, is more flexible and harder to break than a conventional radio-frequency IC tag comprising a silicon chip. It is also possible to use a semiconductor circuit device incorporating the aforementioned conductive thin film or thin film transistor in a mobile device, disposable device, other electronic device or the like.

Embodiment 4

Embodiments 4 and 5 of the present invention to be described below are embodiments realizing a conductive thin film which is further improved in electric conductivity and carrier mobility and which is formed so as to orient molecules of an organic semiconductor compound in a predetermined direction by such simple, convenient and less costly means as to prepare a liquid crystalline organic semiconductor mixture exhibiting liquid crystallinity by hydrogen-bonding a non-liquid-crystalline organic semiconductor compound and a non-liquid-crystalline organic compound together and orient the liquid crystalline organic semiconductor mixture in a predetermined direction, as well as a thin film transistor using such a conductive thin film.

FIG. 7 is a sectional view schematically illustrating a process for forming a conductive thin film according to embodiment 4 of the present invention. For the purpose of avoiding complicated description, the illustration of the process is partially omitted in FIG. 7.

A method of forming a conductive thin film will be described with reference to FIG. 7.

Figure 11A:
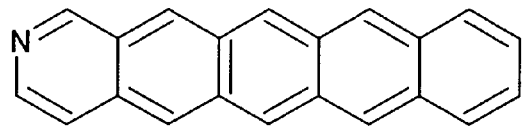
FIG. 11(a) is a structural diagram showing the structure of an organic semiconductor compound material comprising a non-liquid-crystalline pentacene derivative.
Figure 11B:
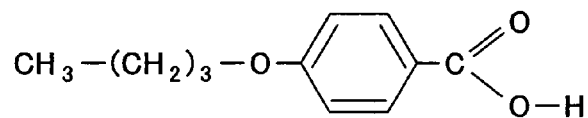
FIG. 11(b) is a structural diagram showing the structure of a non-liquid-crystalline organic compound material.

In the present embodiment, firstly, an organic semiconductor compound material comprising a non-liquid-crystalline pentacene derivative shown in FIG. 11(a) and a non-liquid-crystalline organic compound shown in FIG. 11(b) are mixed together at a molar ratio of about 1:1.

Here, the pentacene derivative compound shown in FIG. 11(a) is a compound wherein at least one carbon atom of a benzene ring located at least a terminal of pentacene as an organic semiconductor compound material is substituted with nitrogen (N) atom, which is electrically more negative than hydrogen atom.

The non-liquid-crystalline organic compound shown in FIG. 11(b) is a benzoic acid derivative having a carboxy group. The benzoic acid derivative shown in FIG. 11(b) desirably has an alkoxy group having at least about three to eight carbon atoms, but is not limited thereto. Though the benzoic acid derivative is used as the non-liquid-crystalline organic compound in the above description, it is possible to use a biphenylcarboxylic acid derivative.

When the non-liquid-crystalline pentacene derivative shown in FIG. 11(a) and the non-liquid-crystalline benzoic acid derivative shown in FIG. 11(b) are mixed together, the pentacene derivative and the benzoic acid derivative are hydrogen-bonded to each other to give a supermolecular liquid crystalline organic semiconductor mixture exhibiting a smectic phase spontaneously by mere mixing. The "supermolecular", as used herein, is meant to represent such a structure of the liquid crystalline organic semiconductor mixture prepared by mixing the pentacene derivative and the benzoic acid derivative together as to exhibit liquid crystallinity, which is a new property, despite the fact that the pentacene derivative and the benzoic acid derivative, singly, exhibit neither molecular orientation nor liquid crystallinity. Though the aforementioned liquid crystalline organic semiconductor mixture is a mixture produced based on hydrogen bond having a lower bonding power than covalent bond, the liquid crystalline organic semiconductor mixture is a stable material which can be handled in a process at a temperature close to room temperature.

Figure 7A:
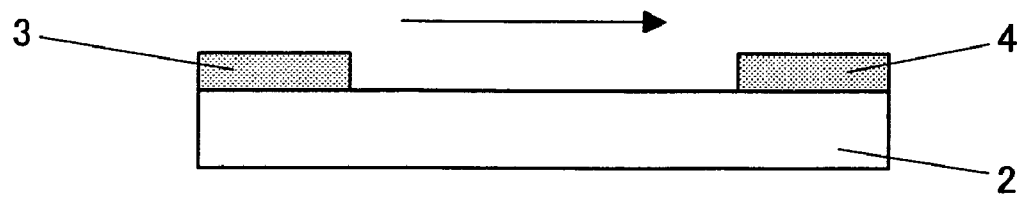
FIG. 7 is a sectional view schematically illustrating a process for forming a conductive thin film according to embodiment 4 of the present invention.

Subsequently, at least two electrodes 3 and 4 are disposed opposite to each other on a substrate 2 comprising a glass or plastic substrate or a like substrate, as shown in FIG. 7(a). In preparation for an intended liquid crystalline phase to be oriented, a polyimide film having a thickness of 100 nm is formed by spin coating and then baked to form an orientation film (not shown) on the substrate 2. Then, at least a portion of the orientation film extending between the electrodes 3 and 4 is subjected to an orientation treatment. As in a method employed in the liquid crystal display technology to orient a liquid crystal material injected between opposite substrates, the orientation treatment is rubbing of the orientation film surface with dust-free cloth in a predetermined direction, for example, in the direction from the electrode 3 toward the electrode 4 (indicated by arrow).

Figure 7B:
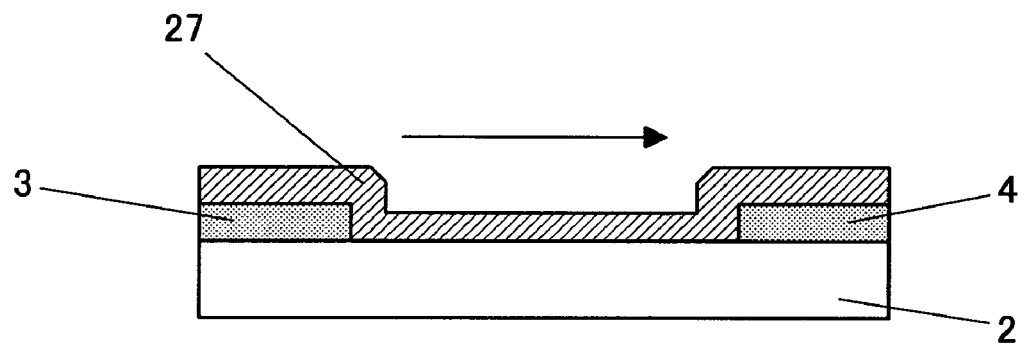

Referring to FIG. 7(b), the non-liquid-crystalline pentacene derivative (see FIG. 11(a)) and the non-liquid-crystalline benzoic acid derivative (see FIG. 11(b)) are mixed together to prepare a liquid crystalline organic semiconductor mixture 27 given a supermolecular structure based on hydrogen bond. The liquid crystalline organic semiconductor mixture 27 thus prepared is applied to a thickness of about 1 μm over the orientation film, which has undergone the orientation treatment in the step of FIG. 7(a), on the substrate 2 by casting.

Figure 7C:
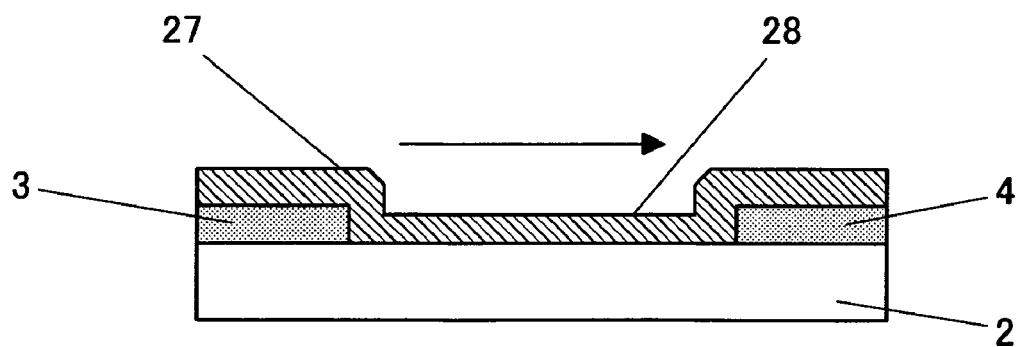

In the resulting conductive thin film 28 shown in FIG. 7(c), the longitudinal axes of supermolecules in the supermolecular structure of the liquid crystalline organic semiconductor mixture 27 exhibiting a smectic phase are oriented in the predetermined direction indicated by arrow, which causes the longitudinal axes of molecules of the pentacene derivative to be oriented in a desired direction, molecules of the pentacene derivative being constituent molecules of the supermolecules. That is, since the thickness of the conductive thin film 28 is small, the longitudinal axes of pentacene derivative molecules, which are internal constituent molecules present in the liquid crystalline organic semiconductor mixture 28, are aligned in a desired fixed direction, for example, in the direction from the electrode 3 toward the electrode 4, relative to the molecules of the liquid crystalline organic semiconductor mixture 28 oriented in the fixed predetermined direction by the orientation treatment. Accordingly, by adjusting the alignment direction of the liquid crystalline organic semiconductor mixture 27 to a predetermined direction by means of the aforementioned orientation treatment, it is possible to adjust alignment of the longitudinal axes of the organic semiconductor compound to a desired direction. In FIG. 7(c), the aforementioned predetermined direction and the aforementioned desired direction are substantially the same as the direction across the electrodes (indicated by arrow). Note that some combinations of compounds to be used may cause the desired direction to differ from the predetermined direction, which is the orientation treatment direction and, therefore, the predetermined direction need be selected so that the desired direction is obtained as intended.

The conductive thin film 28 according to the present embodiment, wherein the longitudinal axes of pentacene derivative molecules in the liquid crystalline organic semiconductor mixture 27 are oriented in the desired direction, allows charge transfer in the direction across the electrodes to be made smoothly and is improved in electric conductivity and carrier mobility. The conductive thin film 28, which was formed as a conductive thin film or organic semiconductor thin film, exhibited a carrier mobility of about 0.3 $cm^2/V$, which is the same level of carrier mobility as conventional crystalline pentacene film formed by vapor deposition.

Figure 8:
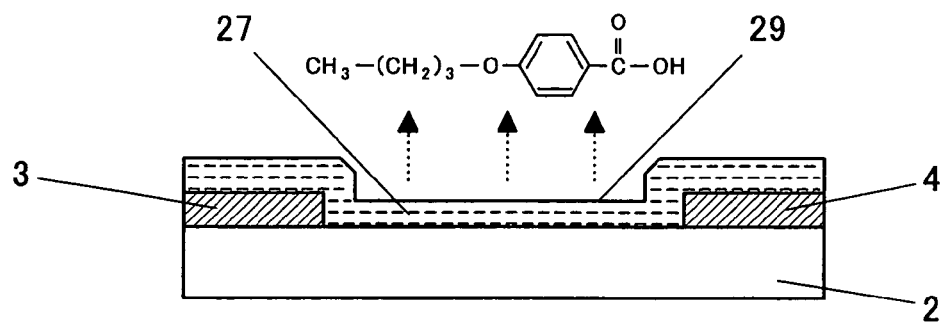
FIG. 8 is a sectional view schematically showing the structure of another conductive thin film according to embodiment 4 of the present invention.

FIG. 8 is a sectional view schematically showing the structure of another conductive thin film according to embodiment 4 of the present invention.

A conductive thin film 29 shown in FIG. 8 is different from the conductive thin film 28 shown in FIG. 7 in that an organic compound component as constituent molecules that are unnecessary from at least the viewpoint of charge transfer is removed from the liquid crystalline organic semiconductor mixture 27 forming the conductive thin film 28 shown in FIG. 7(c). More specifically, the benzoic acid derivative component which is an organic compound acting to impede charge transfer is removed from the liquid crystalline organic semiconductor mixture 27 having a supermolecular structure based on hydrogen bond between the non-liquid-crystalline pentacene derivative shown in FIG. 11(a) and the non-liquid-crystalline benzoic acid derivative shown in FIG. 11(b), which are mixed together to form the liquid crystalline organic semiconductor mixture 27. In order to remove the benzoic acid derivative component from the liquid crystalline organic semiconductor mixture 27, the liquid crystalline organic semiconductor mixture 27 is heated to break the hydrogen bond thereby causing the benzoic acid derivative component to dissipate. For example, by heating the liquid crystalline organic semiconductor mixture 27 shown in FIG. 7(c) to about 180° C., the benzoic acid derivative shown in FIG. 11(b) as constituent molecules that were unnecessary from the viewpoint of charge transfer was caused to sublimate and dissipate. Thus, the conductive thin film 29 having favorable characteristics could be formed in which only the pentacene derivative shown in FIG. 11(a) remained as the organic semiconductor compound oriented in the predetermined direction.

The structure of the other conductive thin film 29 formed using the pentacene derivative organic semiconductor according to the present embodiment exhibited a further improved carrier mobility as high as about 1.0 cm$^2$/Vs, which confirmed that it was possible to form a conductive thin film having a carrier mobility that was more improved than the high carrier mobility of the pentacene organic semiconductor compound. The value of carrier mobility exhibited is higher than the carrier mobility (about 0.6 cm$^2$/Vs) of the crystal phase of a pentacene organic semiconductor formed by the conventional vapor deposition. It was also confirmed that the conductive thin film 29 could be stably formed over a large area of 100×100 mm on a supple substrate substantially uniformly and any defect did not occur even when the plastic substrate was subjected to certain flexing.

In the above description, the method of removing the organic compound impeding charge transfer from the liquid crystalline organic semiconductor mixture 27 includes heating the liquid crystalline organic semiconductor mixture 27 to remove the unnecessary organic compound; however, there is no limitation to this method. For example, it is possible to employ another method including: forming a conductive thin film by using a liquid crystalline organic semiconductor compound that exhibits liquid crystallinity when mixed with a photosensitive organic compound; and allowing the photosensitive organic compound to volatilize or sublimate by ultraviolet irradiation or heating.

With the above-described structure, the conductive thin film according to the present invention can be stably formed to have a carrier mobility that is more improved than the high carrier mobility of the organic semiconductor compound by a simple and convenient method which includes: preparing the liquid crystalline organic semiconductor mixture by mixing the non-liquid-crystalline organic semiconductor compound and the non-liquid-crystalline organic compound together to allow these compounds to be hydrogen-bonded; coating the mixture to a predetermined region; and orienting the mixture in the predetermined direction thereby causing at least the organic semiconductor compound to be oriented in the predetermined direction.

With the structure of the other conductive thin film according to the present invention, it is possible to further improve the carrier mobility of the conductive thin film than the high carrier mobility of the organic semiconductor compound and form the conductive thin film stably by removing at least the organic compound component acting to impede charge transfer from the liquid crystalline organic semiconductor mixture.

While the present embodiment uses the pentacene derivative shown in FIG. 11(a) which is substituted with one nitrogen atom, it is possible to use a pentacene derivative in which plural carbon atoms are substituted with nitrogen atoms without limitation on the above-noted mixture ratio thereof. For example, a pentacene derivative molecule substituted with two nitrogen atoms can form a double hydrogen bond to two molecules of the benzoic acid derivative shown in FIG. 11(b), to give a liquid crystalline organic semiconductor mixture having a supermolecular structure as shown in FIG. 11(d).

Methods of coating of the liquid crystalline organic semiconductor mixture 27 which can be employed in the above-described embodiment include dropping, spinner coating, dip coating, such printing as screen printing, roll coating, ink-jet coating, spray coating, and other coating methods, in addition to the aforementioned casting.

Methods of orienting the conductive thin film 28,29 or organic semiconductor thin film comprising the liquid crystalline organic semiconductor mixture 27 in the predetermined direction which can be employed in the above-described embodiment include: a method including forming the conductive thin film or organic semiconductor film over an orientation film having subjected to the orientation treatment; a method including applying the conductive thin film or organic semiconductor film with an electric field; and a method including applying the conductive thin film or organic semiconductor film with a magnetic field. These orientation treatment methods are applicable to all the embodiments of the present invention.

Examples of orientation films for use in the above-described embodiment include inorganic-type orientation films such as a silicon oxide film or the like, and organic-type orientation films such as a nylon film, polyvinyl alcohol film, polyimide film, and monomolecular film. These orientation films are formed by oblique vapor deposition or rotary vapor deposition and are oriented in a fixed direction by using a polymer liquid crystal or an LB film or by utilizing a magnetic field, spacer edge method, rubbing, or the like. Such an orientation film may be formed to have only the function as an orientation film or various functions as an insulating film, gate insulator and the like. A surface of an insulating substrate may be used as such an orientation film.

Embodiment 5

Figure 9:
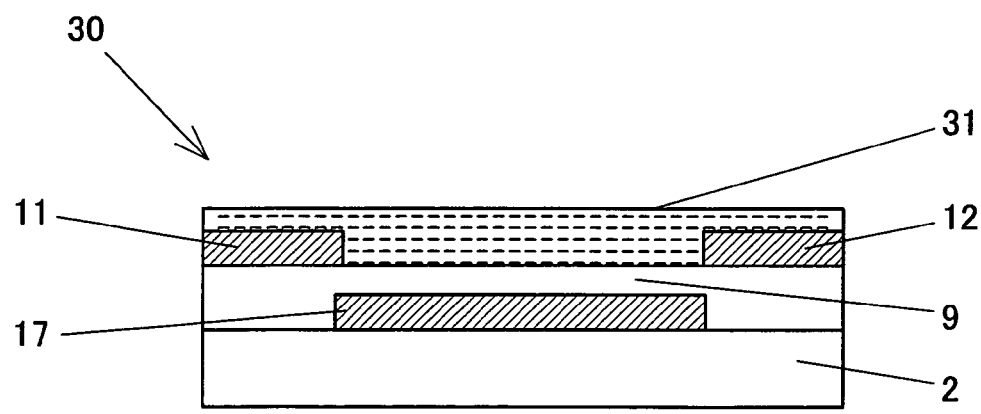
FIG. 9 is a sectional view schematically showing the construction of a thin film transistor according to embodiment 5 of the present invention.

FIG. 9 is a sectional view schematically showing the construction of a thin film transistor according to embodiment 5 of the present invention.

The thin film transistor 30 shown in FIG. 9 includes a gate electrode 17 of a desired shape formed on an insulating substrate 2, and a semiconductor layer 31 forming a channel layer and formed above the gate electrode 17 with an intervening gate insulator 9 therebetween. Also, source electrode 11 and drain electrode 12 are formed between the insulating substrate 2 and the semiconductor layer 31 so as to connect directly to the semiconductor layer 31. Usually, a cap layer is stacked over the gate electrode 17, source and drain electrodes 11 and 12 and semiconductor layer 31. Further, lead electrodes, which are not shown for avoiding complicated illustration, are connected to respective of the source and drain electrodes 11 and 12.

Figure 10A:
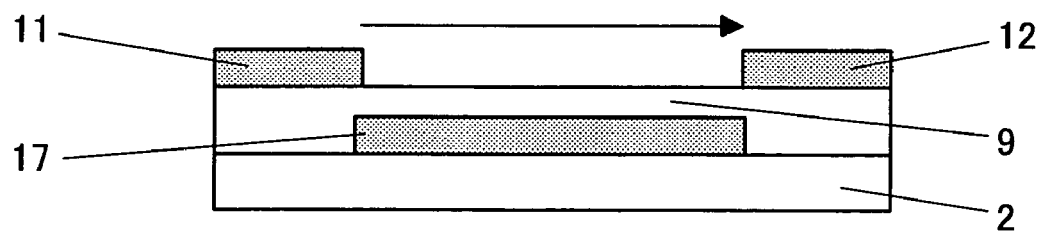
FIG. 10 is a sectional view schematically illustrating a process for fabricating the thin film transistor according to embodiment 5 of the present invention.

FIG. 10 is a sectional view schematically illustrating a process for fabricating the thin film transistor according to the present embodiment. In FIG. 10, some conventional parts or components required in fabricating the thin film transistor are omitted for avoiding complicated illustration.

In the present embodiment, firstly, an aluminum film is formed to a thickness of 300 nm on a surface of the insulating substrate 2 comprising a plastic substrate or a glass substrate. The aluminum film thus formed is patterned by photolithography and etching to form the gate electrode 17.

Subsequently, a polyimide film having a thickness of 100 nm is formed to cover the gate electrode 17 and the exposed portion of the substrate 2 by spin coating, thus forming the gate insulator 9.

Subsequently, an indium tin oxide film (ITO) as a conductive thin film is formed to a thickness of 300 nm on the gate insulator 9 by EB evaporation at a substrate temperature of 100° C. and then subjected to photolithography and etching to form the source and drain electrodes 11 and 12. At least a portion of the gate insulator 9 lying between the source and drain electrodes 11 and 12 is subjected to an orientation treatment. Alternatively, the source and drain electrodes 11 and 12 may be formed on the polyimide gate insulator 9 having subjected to the orientation treatment. The method of orientation treatment employed here includes rubbing the surface of the gate insulator 9 with dust-free cloth in a predetermined direction, for example, in one direction across the source and drain electrodes 11 and 12 (indicated by arrow), like the method employed in embodiment 4. Such an orientation treatment allows the longitudinal axes of supermolecules of liquid crystalline organic semiconductor mixture 27 (to be described later) to be oriented and aligned in a direction parallel with the rubbing direction.

In turn, the semiconductor layer 31 comprising an organic semiconductor film is formed on the gate insulator 9 to serve as a channel layer, as shown in FIG. 9. The semiconductor layer 31 comprising the organic semiconductor film is formed in the following manner as in the formation of the conductive thin film of embodiment 4.

Figure 10B:
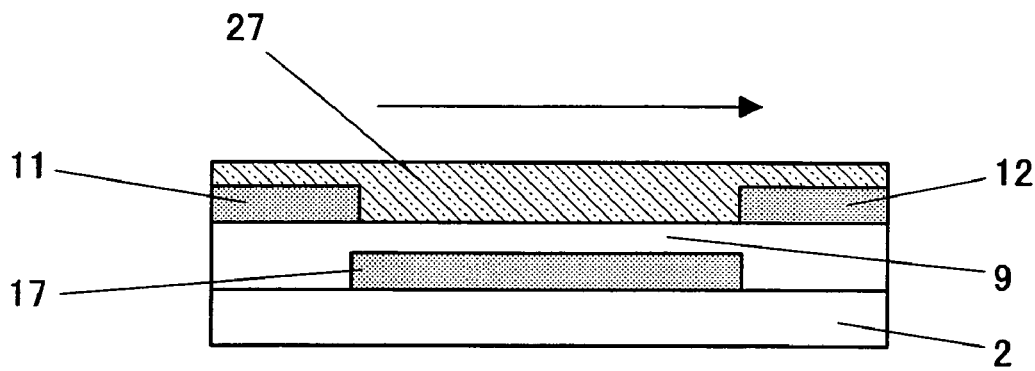
Figure 11C:
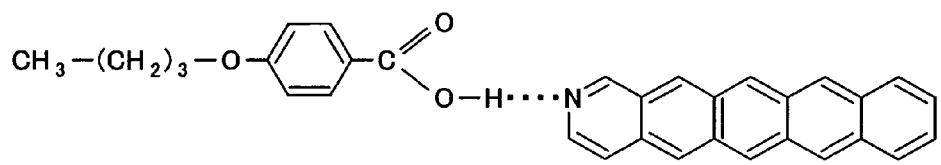
FIG. 11(c) is a structural diagram showing a state where the pentacene derivative is hydrogen-bonded to a benzoic acid derivative.
Figure 11D:
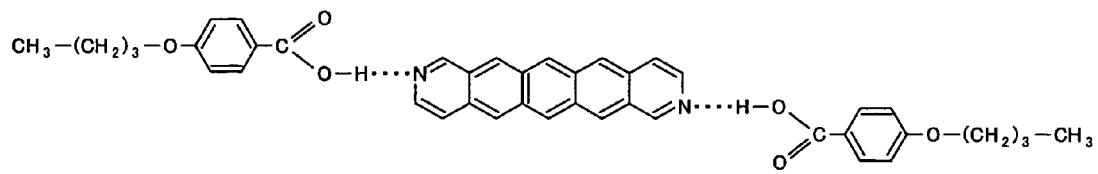
FIG. 11(d) is a structural diagram showing the structure of a liquid crystalline organic semiconductor mixture having a supermolecular structure.

In the step illustrated in FIG. 10(b), the non-liquid-crystalline pentacene derivative shown in FIG. 11(a) and the non-liquid-crystalline benzoic acid derivative shown in FIG. 11(b) are mixed together to prepare the liquid crystalline organic semiconductor mixture 27 given a supermolecular structure based on hydrogen bond as shown in FIG. 11(c). The liquid crystalline organic semiconductor mixture 27 thus prepared is coated to the substrate 2, which has undergone the orientation treatment in the step shown in FIG. 10(a), to a thickness of about 1 μm so as to cover at least the source and drain electrodes 11 and 12 on the substrate 2 by casting. In the liquid crystalline organic semiconductor mixture 27 exhibiting a smectic phase, by orienting the longitudinal axes of molecules of the supermolecular structure thus formed in the predetermined direction (indicated by arrow), it is possible to orient the longitudinal axes of molecules of the pentacene derivative in a desired direction, the molecules of the pentacene derivative being internal constituent molecules of the supermolecules. That is, since the thickness of the conductive thin film 31 comprising the liquid crystalline organic semiconductor mixture 27 is small, the longitudinal axes of pentacene derivative molecules, which are internal constituent molecules present in the liquid crystalline organic semiconductor mixture 27, are aligned in a desired direction that is substantially fixed, for example, in the direction from the source electrode 11 to the drain electrode 12 (indicated by arrow), relative to the molecules of the liquid crystalline organic semiconductor mixture 27 oriented in the predetermined fixed direction by the orientation treatment. In FIG. 10(b), the aforementioned predetermined direction and the aforementioned desired direction are substantially the same as the direction across the electrodes (indicated by arrow). Note that some combinations of compounds to be used may cause the desired direction to differ from the predetermined direction, which is the orientation treatment direction and, therefore, the predetermined direction need be selected so that the desired direction is obtained as intended.

Figure 10C:
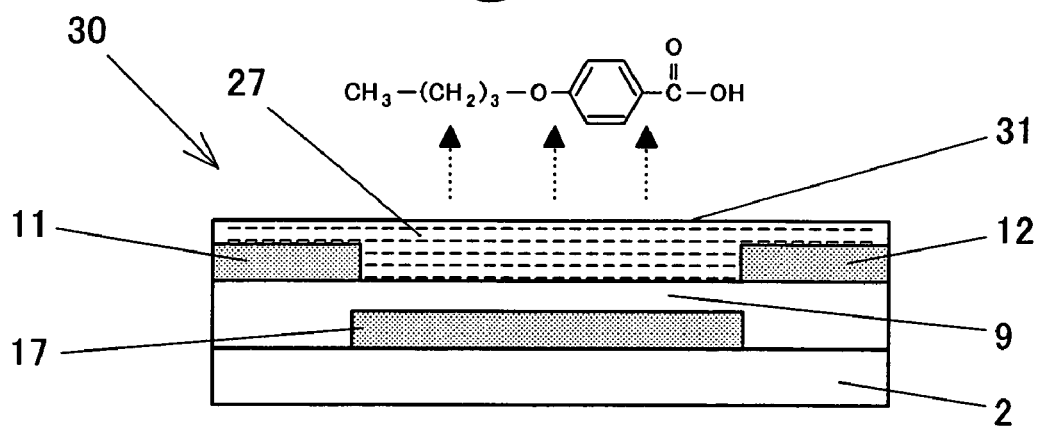

In the step shown in FIG. 10(c), the benzoic acid derivative component which is an organic compound acting to impede charge transfer is removed from the liquid crystalline organic semiconductor mixture 27 in which the non-liquid-crystalline pentacene derivative shown in FIG. 11(a) and the non-liquid-crystalline benzoic acid derivative shown in FIG. 11(b) are mixed together and hydrogen-bonded to each other. In order to remove the benzoic acid derivative component from the liquid crystalline organic semiconductor mixture 27, at least the liquid crystalline organic semiconductor mixture 27 is heated to break the hydrogen bond thereby causing the benzoic acid derivative component to dissipate. In this way, the thin film transistor 30 was fabricated having the conductive thin film 31 which was oriented in the predetermined direction and in which the pentacene derivative remained as the organic semiconductor compound.

The thin film transistor having the semiconductor layer comprising the pentacene derivative organic semiconductor film, which was formed by the simple and convenient method according to the present embodiment, exhibited a high carrier mobility at channel as high as about 1.0 $cm^2/Vs$. That is, the present embodiment was confirmed to be capable of forming a thin film transistor having a more improved carrier mobility than the high carrier mobility of the pentacene organic semiconductor compound. The value of carrier mobility exhibited is higher than the carrier mobility (about 0.6 $cm^2/Vs$) of a thin film transistor having a pentacene organic semiconductor crystal phase formed by the conventional vapor deposition. The present embodiment was also confirmed to be capable of stably forming multiple thin film transistors 30 each having a semiconductor layer comprising conductive thin film 31 from which the benzoic acid derivative component as the organic compound was removed on a flexible substrate having dimensions of 100×100 mm. Further, it was confirmed that any defect was not likely to occur among the multiple thin film transistors even when the plastic substrate was subjected to certain flexing.

As described above, the present embodiment makes it possible to orient the organic semiconductor compound in the predetermined direction by orienting in the predetermined direction the liquid crystalline organic semiconductor mixture which is prepared by mixing the non-liquid-crystalline organic semiconductor compound and the non-liquid-crystalline organic compound together to allow these compounds to be hydrogen-bonded to each other. Also, the present embodiment, which forms the organic semiconductor film by removing the organic compound acting to impede charge transfer by simple and convenient means, makes it possible to provide a thin film transistor having favorable electrical characteristics including a more improved carrier mobility than a high carrier mobility inherent to the organic semiconductor compound. Further, the thin film transistor according to the present embodiment can be provided as a thin film transistor having excellent electrical characteristics and hence are applicable to microcircuit devices, high-performance electronic devices and the like.

The above-described thin film transistor according to the present embodiment comprises the gate insulator, the semiconductor layer disposed in contact with the gate insulator, the gate electrode disposed in contact with one side of the gate insulator on the side opposite away from the semiconductor layer, and the source and drain electrodes disposed in contact with at least one side of the semiconductor layer and aligned with the gate electrode so as to be opposed to each other across the gate electrode. While the thin film transistor according to the present invention has been described as a bottom-gated thin film transistor having the gate electrode on the substrate, or on the bottom, the thin film transistor of the present invention may be a top-gated thin film transistor having the gate electrode on the gate insulator on the side opposite away from the substrate, or on the top.

In the fabrication of the thin film transistor 30 according to embodiment 5 of the present invention, the material usable for the gate electrode 17 and the source and drain electrodes 11 and 12 may be any material which is electrically conductive and unreactive to each of the substrate 2 and the semiconductor layer. Examples of such usable materials include doped silicon, precious metals such as gold, silver, platinum and palladium, alkali metals or alkali earth metals such as lithium, cesium, calcium and magnesium, and metals such as copper, nickel, aluminum, titanium and molybdenum, or alloys thereof. Other usable materials include conductive organic materials such as polypyrrole, polythiophene, polyanilne and polyphenylenevinylene. Since the thin film transistor is operable if the gate electrode has a higher electric resistance than other electrodes, the gate electrode in particular may comprise a material different from that of the source and drain electrodes.

The material usable for the aforementioned gate insulator 9 may be any material which has an electric insulating property and is unreactive to any one of the substrate 2, electrodes and semiconductor layer. The substrate 2 and the gate insulator 9 may be in a form wherein a typical silicon oxide film is formed on silicon so as to be used as the gate insulator, or in a form wherein a thin layer of resin or the like is formed after the formation of an oxide film so as to function as the gate insulator. The gate insulator 9 may be formed by deposition of a compound consisting of elements different from those forming the substrate 2 and from those forming the electrodes by means of CVD, vapor deposition, sputtering or the like, or by coating, spraying, electrodeposition or the like of a solution of such a compound. Since it is known that a material having a high dielectric constant is used as the material of gate insulator 9 in order to lower the gate voltage of the thin film transistor 30, the gate insulator 9 may be formed using a compound having a high dielectric constant other than ferroelectric compounds and ferroelectrics. Besides inorganic materials, it is possible to use organic materials having high dielectric constants such as polyvinylidene fluoride compounds, polyvinylidene cyanide compounds and the like.

Since the present embodiment can use the conventional low-temperature thin film formation technology in the formation of a thin film or a semiconductor layer, it is possible to use, besides a flexible plastic sheet that can be bent and a thin glass substrate, a resin film substrate having suppleness such as a thin polyimide film as the aforementioned substrate 2. For example, it is possible to use polyethylene film, polystyrene film, polyester film, polycarbonate film, polyimide film and a like film. Such a film can provide for a flexible paper display, sheet display or the like having a substrate comprising a plastic sheet or a resin film.

As described above, the thin film transistor fabrication method according to the present invention is capable of forming a conductive thin film oriented in a desired direction simply and conveniently by coating a substrate with the liquid crystalline organic semiconductor mixture prepared by mixing the non-liquid-crystalline organic semiconductor compound and the non-liquid-crystalline organic compound together to allow these compounds to be hydrogen-bonded to each other and orienting the resulting film in a predetermined direction. Also, since it is possible to remove the organic compound impeding at least charge transfer from the liquid crystalline organic semiconductor mixture by a simple and convenient method, a thin film transistor having a semiconductor layer comprising a conductive thin film having a more improved carrier mobility than the high carrier mobility inherent to the organic semiconductor compound can be fabricated inexpensively.

In the description of embodiments 4 and 5, the pentacene derivative and the benzoic acid derivative are hydrogen-bonded to each other to give the liquid crystalline organic semiconductor mixture. However, the liquid crystalline organic semiconductor mixture may comprise any organic semiconductor compound and any organic compound as long as the liquid crystalline organic semiconductor mixture exhibits liquid crystallinity resulting from hydrogen-bonding of the organic semiconductor compound and the organic compound to each other. Therefore, it is required that each of the organic semiconductor compound and the organic compound for use in the present invention have at least one element selected from the group consisting of nitrogen, oxygen, sulfur and halogen atoms which are electrically more negative than hydrogen atom for these compounds to be hydrogen-bonded to each other. Preferably, the organic semiconductor compound and the organic compound are compounds having respective elements that can be bonded to each other via hydrogen. Each of the organic semiconductor compound and the organic compound for use in the present invention preferably has at least one of an unsaturated bond and a benzene ring which can be bonded to any one selected from the aforementioned group consisting of nitrogen, oxygen, sulfur and halogen atoms.

While the above-described embodiment uses the pentacene derivative as the organic semiconductor compound, it is possible to use derivatives of acene-type organic semiconductor compounds such as naphthacene and tetracene as well as pentacene, derivatives of phthalocyanine-type organic semiconductor compounds such as a copper phthalocyanine derivative, or derivatives of thiophene-type organic semiconductor compounds.

Further, the above-described supermolecular structure of the liquid crystalline organic semiconductor mixture exhibiting liquid crystallinity which is prepared by mixing the non-liquid-crystalline organic semiconductor compound and the non-liquid-crystalline organic compound together to allow these compounds to be hydrogen-bonded to each other may be either a substantially rod-like supermolecular structure like a nematic or smectic liquid crystal or a disk-like supermolecular structure such as a discotic liquid crystal.

Other features are similar to the corresponding features of embodiments 1 to 3.

Embodiment 6

Embodiments 6 and 7 of the present invention to be described below are embodiments realizing a conductive thin film which is further improved in electric conductivity and carrier mobility and which is formed by using a mixed composition layer comprising an organic semiconductor compound having a first liquid crystalline phase of a high order and an organic compound exhibiting a second liquid crystalline phase of a low order and causing the second liquid crystalline phase of the lower order to be exhibited thereby causing molecules of the organic semiconductor compound to be oriented in a predetermined direction, as well as a thin film transistor employing such a conductive thin film.

FIG. 12 is a sectional view schematically illustrating a process for forming a conductive thin film according to embodiment 6 of the present invention. In FIG. 12, the process is partially omitted for avoiding complicated illustration.

Hereinafter, the process for forming the conductive thin film according to the present embodiment will be described in detail with reference to FIG. 12.

Figure 16:
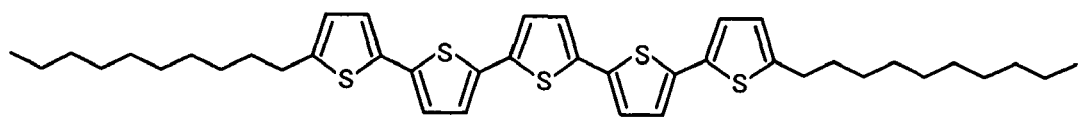
FIG. 16 is a structural diagram showing the structure of an oligothiophene derivative.

The organic semiconductor compound for use in the present embodiment is an organic semiconductor compound having a liquid crystalline phase of a high order at a high temperature (i.e., a liquid crystal phase of low symmetry) or a liquid crystalline phase of a potentially high order. Specifically, use is made of a material comprising at least an organic semiconductor compound having the first liquid crystalline phase of a high order like a smectic liquid crystalline phase at a high temperature. More specifically, use is made of a material comprising at least a low polymer organic semiconductor compound, for example, an oligothiophene derivative as shown in FIG. 16 which has a smectic liquid crystalline phase at a high temperature. The expression "the organic semiconductor compound having a liquid crystal phase of a high order at a high temperature", as used above, means that a crystallization temperature at which crystallization occurs from at least the liquid crystalline phase of a high order is not lower than room temperature and the liquid crystalline phase of a high order is exhibited at a temperature within a temperature range that is higher than the crystallization temperature.

The oligothiophene derivative shown in FIG. 16 is an organic semiconductor compound comprising Dec-5T-Dec (wherein Dec represents an alkyl group having 10 carbon atoms) including five thiophene rings T bonded to each other as inverted every other ring. From the result of measurement made by differential scanning thermal analysis (DSC), it is known that this Dec-5T-Dec has a smectic liquid crystalline phase at a temperature within a high temperature range from 100° C. to 170° C., crystallizes at a temperature not higher than 100° C., and turns into an isotropic liquid at a temperature not lower than 170° C.

Figure 17A:
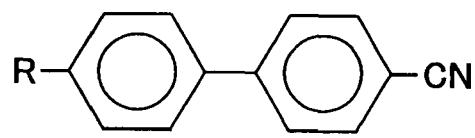
FIG. 17 is a structural diagram showing the structure of an organic compound material to be mixed with the oligothiophene derivative; specifically, FIGS. 17(a) and 17(b) each show the structure of a cyanobiphenyl-type organic compound material
FIG. 17(c) shows the structure of a cyanoterphenyl-type (biphenyl-type) organic compound material.
Figure 17B:
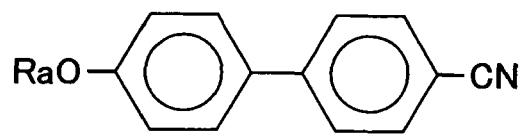
Figure 17C:
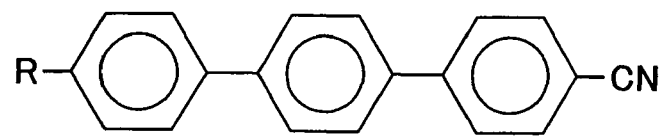
Figure 18:
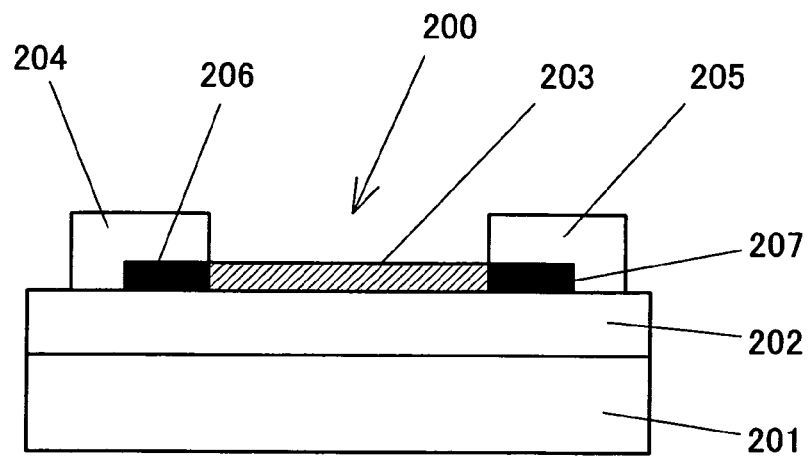
FIG. 18 is a sectional view schematically showing the construction of a conventional thin film transistor using carbon nanotube in a semiconductor layer.
Figure 19:
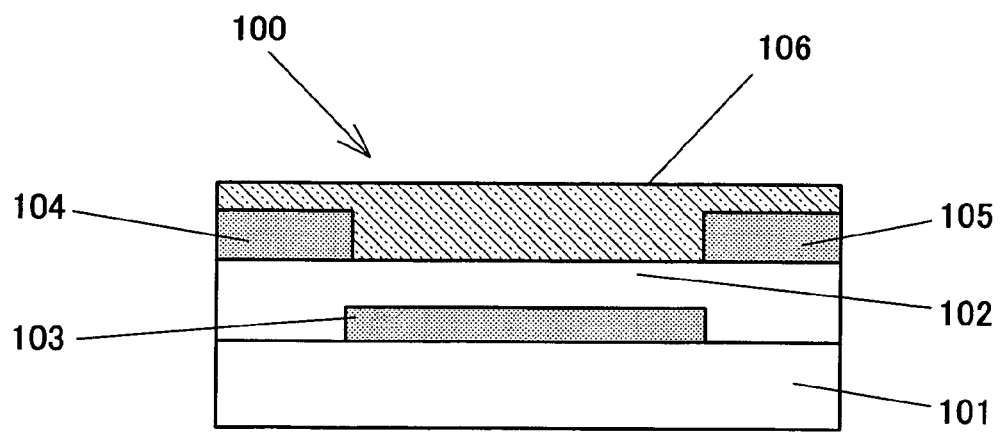
FIG. 19 is a sectional view schematically showing the construction of a conventional thin film transistor in which a semiconductor layer comprises an organic semiconductor polymer having a liquid crystalline substituent group introduced as side chain.

An organic compound material to be mixed with the oligothiophene derivative as the aforementioned organic semiconductor compound is a liquid crystal compound prepared by mixing of organic compounds each exhibiting at least the second liquid crystalline phase like a nematic phase of a low order (i.e., a liquid crystalline phase of high low symmetry), for example, cyanobiphenyl-type compounds as shown in FIGS. 17(a) and 17(b) or cyanoterphenyl-type compounds as shown in FIG. 17(c) (hereinafter will be generally referred to as biphenyl-type compounds).

In the biphenyl-type liquid crystal compounds shown in FIG. 17, R and Ra are each a straight- or branched-chain alkyl group having at least 3 to 8 carbon atoms. Such biphenyl-type liquid crystal compounds form a nematic liquid crystal compound comprising plural components in which R and Ra are different. A mixed nematic liquid crystal compound prepared by mixing a liquid crystal compound of another type with such a nematic liquid crystal compound may be used. It is also possible to use a nematic liquid crystal compound not substituted with a cyano or fluoro group.

The temperature range within which the organic compound exhibits a nematic liquid crystalline phase may be lower or higher than the temperature range within which the organic semiconductor compound exhibits a smectic phase.

Figure 13:
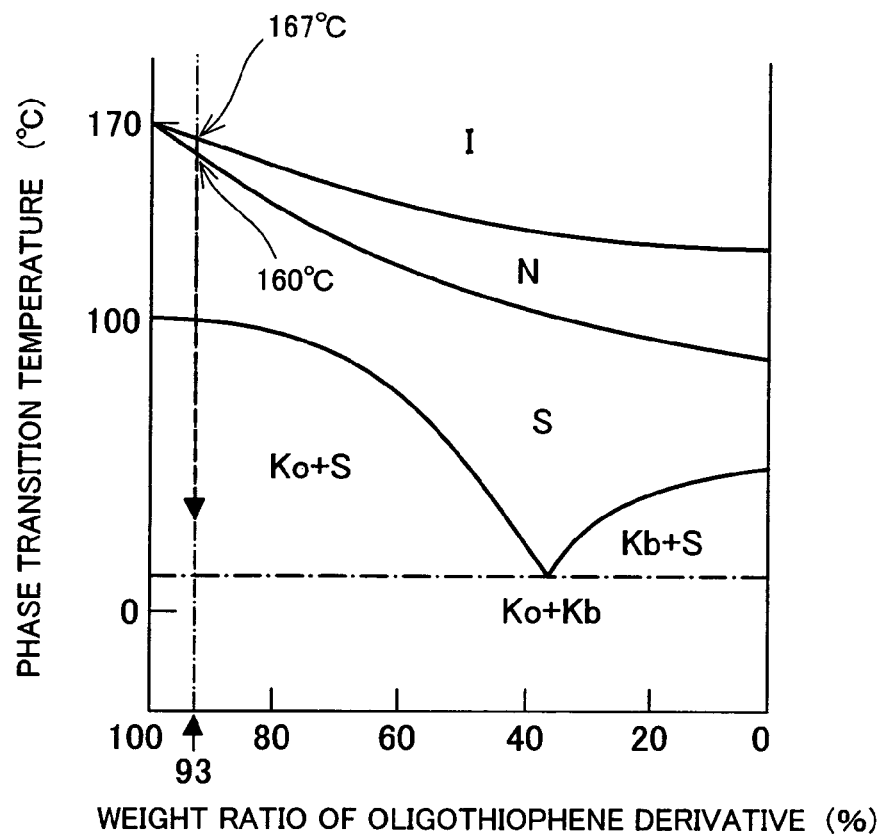
FIG. 13 is a conceptual diagram showing an exemplary phase diagram of a mixed composition comprising an organic semiconductor compound and an organic compound according to embodiment 6 of the present invention.

FIG. 13 is a conceptual diagram showing an exemplary phase diagram of a mixed composition comprising an organic semiconductor compound and an organic compound according to the present embodiment. In FIG. 13, the abscissa represents the weight (%) of the oligothiophene derivative and the weight of the biphenyl liquid crystal compound increases with decreasing weight of the oligothiophene derivative. The ordinate in FIG. 13 represents the phase transition temperature (° C.).

As shown in FIG. 13, the oligothiophene derivative Dec-5T-Dec as the organic semiconductor compound has a smectic phase (S) at a temperature within the range from 100° C. to 170° C. and turns into an isotropic liquid (I) at a temperature not lower than 170° C. However, as can bee seen from FIG. 13, a mixed composition prepared by mixing 93 wt % of the oligothiophene derivative Dec-5T-Dec as the organic semiconductor compound and 7 wt % of the biphenyl-type liquid crystal compound exhibits a nematic phase (N) within the temperature range from 160° C. to 167° C.

Based on the phase diagram shown in FIG. 13, for example, a mixed composition is prepared comprising a mixture of at least 93 wt % of the organic semiconductor compound having the first liquid crystalline phase of a high order at a high temperature or of a potentially high order and 7 wt % of the organic compound exhibiting the second liquid crystalline phase of a low order like a nematic phase. In this preparation, the above-described mixed composition may be blended with an organic solvent such as chlorobenzene for easy coating.

Though the mixture ratio between the organic semiconductor compound and the organic compound depends upon the kinds of the two materials to be used or the desired electrical characteristics, the mixed composition preferably contains the organic semiconductor compound in a highest possible proportion, so that desired high characteristics can be obtained easily. The mixed composition desirably contains 70 to 98 wt % of the organic semiconductor compound, more desirably 90 to 95 wt % of the organic semiconductor compound. Such a mixed composition can obtain much higher characteristics. The present invention is not limited to the above-noted mixture ratios.

Figure 12A:
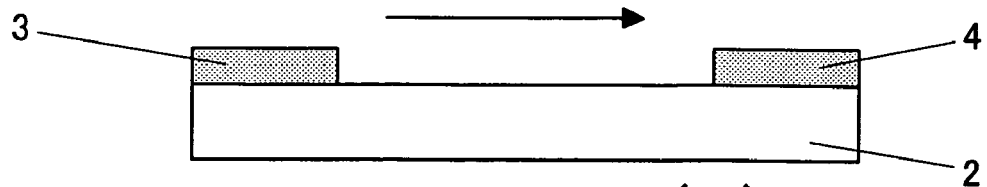
FIG. 12 is a sectional view schematically illustrating a process for forming a conductive thin film according to embodiment 6 of the present invention.

Subsequently, at least two electrodes 3 and 4 are disposed opposite to each other on a substrate 2 such as a glass substrate or a plastic substrate, as shown in FIG. 12(a). A polyimide film is formed to a thickness of 100 nm by spin coating and then baked to form an orientation film (not shown) for orienting the second liquid crystal phase to be exhibited. Thereafter, at least a portion of the orientation film which extends over the electrodes 3 and 4 is subjected to an orientation treatment. The method of orientation treatment employed here includes rubbing the surface of the orientation film with dust-free cloth in a desired fixed direction, for example, in the direction from the electrode 3 toward the electrode 4 (indicated by arrow) like the method employed in the liquid crystal display technology to orient a liquid crystal material injected between opposite substrates.

Figure 12B:
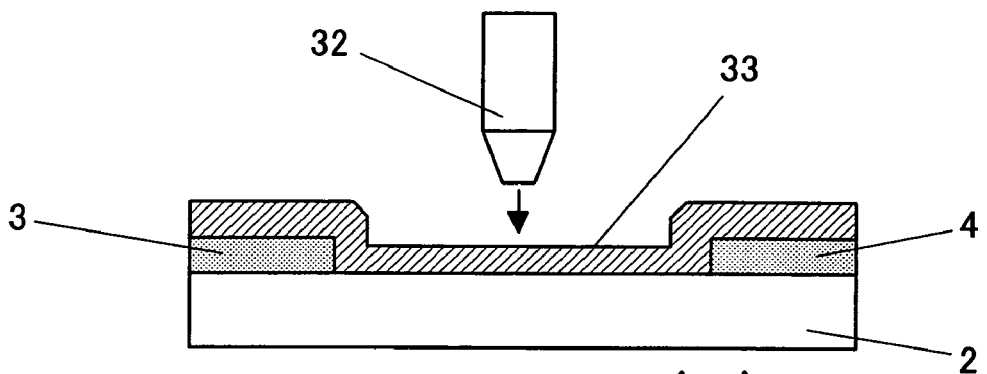

Subsequently, a solution of the aforementioned mixed composition is dropped to an orientation-treated region extending over the electrodes 3 and 4 on the substrate 2 from a dropping nozzle 32 by a dropping method to form a film having a thickness of about 1 μm, as shown in FIG. 12(b). Thereafter, at least a solution portion of the mixed composition is heated to dissipate the organic solvent from the solution of the mixed composition, thus forming a mixed composition layer 33.

Figure 12C:
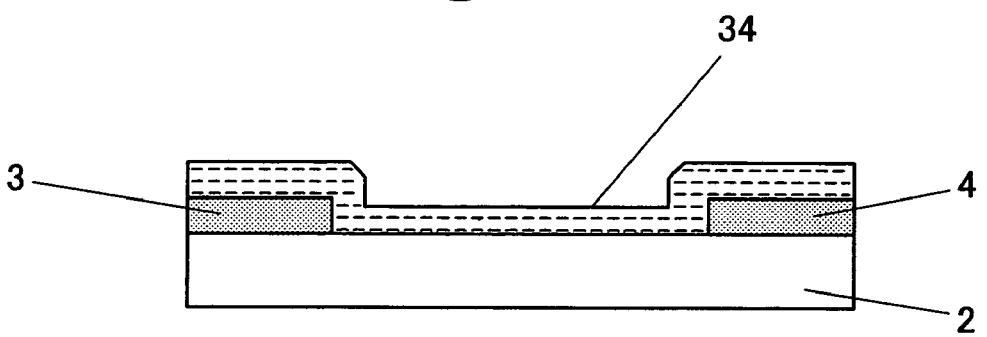
Figure 12D:
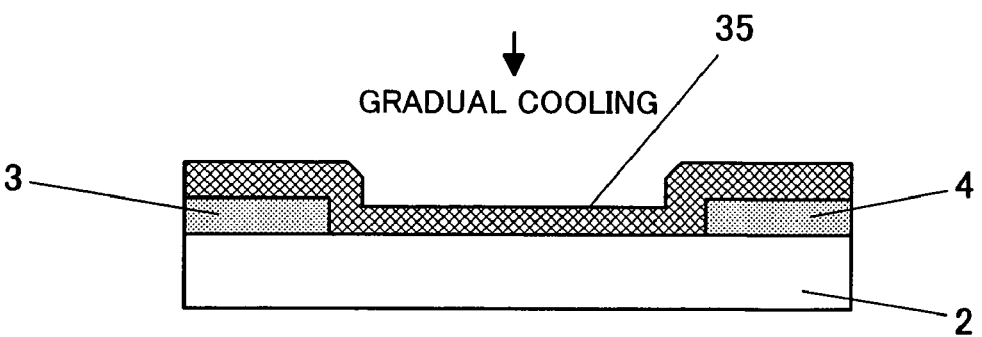

Subsequently, the mixed composition layer 33 coating at least the space between the electrodes 3 and 4 is left within a predetermined temperature range, as shown in FIG. 12(c). The "predetermined temperature range", as used here, is meant by a temperature range that allows the mixed composition to exhibit a nematic phase as the second liquid crystalline phase of a low order containing the oligothiophene derivative shown in FIG. 16. The mixed composition layer 33 comprising the mixture of 93 wt % of the organic semiconductor compound and 7 wt % of the organic compound as exemplified in the present embodiment exhibited nematic phase 34 oriented in a desired direction as the second liquid crystalline phase of a low order over the electrodes 3 and 4 within the temperature range from 160° C. to 167° C. in conformance with the phase diagram at FIG. 13.

Subsequently, the nematic phase 34 exhibited in at least the space between the electrodes 3 and 4 and the boundaries thereof is gradually cooled and solidified to form the conductive thin film 35 comprising the mixed composition layer 33 containing 93 wt % of the organic semiconductor compound and oriented in the predetermined direction. As apparent from the conventional liquid crystal technology, it is possible to form a solid phase maintaining the composition of mixture and orientation of the nematic phase 34 by gradually cooling and solidifying the namatic phase 34. Since the film thickness of the mixed composition layer 33 formed is small, the skeletal chains of the oligothiophene derivative which is mixed with the biphenyl-type liquid crystal compound and in which thiophene rings are bonded to each other are aligned in the predetermined fixed direction, for example, in the direction from the electrode 3 toward the electrode 4, relative to the molecules of the biphenyl-type liquid crystal compound oriented in the desired fixed direction by the orientation treatment. Accordingly, by adjusting the alignment direction of the organic compound mixed which exhibits the nematic phase to the predetermined direction by means of the aforementioned orientation treatment, it is possible to adjust alignment direction of the skeletal chains of the organic semiconductor compound to the predetermined direction.

In the above description, the predetermined direction in which the organic compound is oriented by the orientation treatment and the predetermined direction in which the skeletal chains of the organic semiconductor compound are aligned due to the orientation of the organic compound may be the same or different. That is, the indispensable feature of the present invention is that the organic semiconductor compound is aligned in the predetermined direction.

The conductive thin film 35 formed according to the present embodiment exhibited a high carrier mobility as high as $10^{-2}$ cm$^2$/Vs. Thus, it was confirmed that the characteristics of the conductive thin film in which the oligothiophene derivative was oriented in the substantially fixed predetermined direction were improved. In contrast, a conductive thin film formed using the same oligothiophene derivative as used in the present embodiment by vapor deposition exhibited is a low carrier mobility as low as $10^{-3}$ cm$^2$/Vs.

It was found from the above-described results that the conductive thin film was further improved in carrier mobility and electric conductivity which was formed by the process including: using the mixed composition layer comprising a mixture of the organic semiconductor compound having the first liquid crystalline phase of a high order at a high temperature and the organic compound exhibiting the second liquid crystalline phase of a low order; leaving the mixed composition layer within the predetermined temperature range to allow the mixed composition layer to exhibit the second liquid crystalline phase of a low order containing the organic semiconductor compound between the electrodes formed on the substrate; and causing the second liquid crystalline phase to be oriented in the predetermined direction, thereby also orienting the molecules of the organic semiconductor compound in the predetermined direction.

Preferably, the first liquid crystalline phase is a smectic phase and the second liquid crystalline phase is a nematic phase. By combining controls over these liquid crystalline phases, the conductive thin film can be formed easily. The organic semiconductor compound comprises such a low polymer organic semiconductor compound as the oligothiophene derivative. By orienting the low polymer organic semiconductor compound substantially uniformly, the conductive thin film containing the low polymer organic semiconductor compound can be improved in such electrical characteristics as carrier mobility and electric conductivity.

In the foregoing description, the oligothiophene derivative as the organic semiconductor compound is a derivative comprising plural thiophene rings bonded to each other. Since such an oligothiophene derivative comprising at least 4 to 6 thiophene rings bonded to each other has a smectic phase under a high temperature condition, the present invention can use such oligothiophene derivatives.

Embodiment 7

Figure 14:
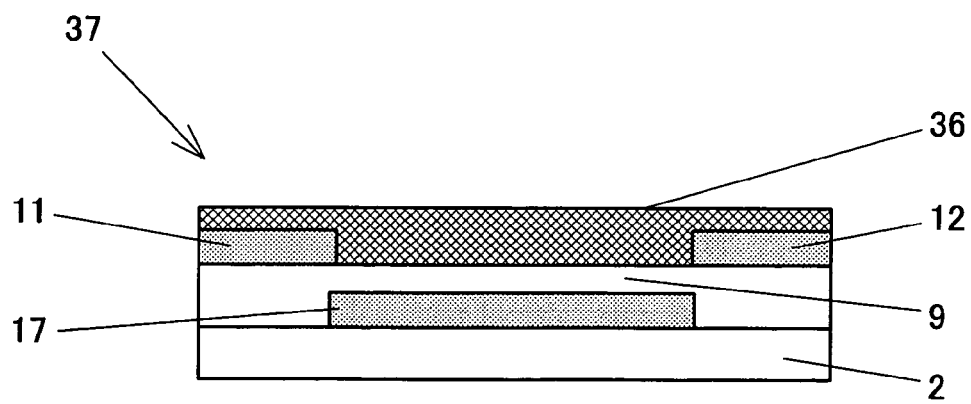
FIG. 14 is a sectional view schematically showing the construction of a thin film transistor according to embodiment 7 of the present invention.

FIG. 14 is a sectional view schematically showing the construction of a thin film transistor according to embodiment 7 of the present invention.

The thin film transistor 37 shown in FIG. 14 includes a gate electrode 17 of a desired shape formed on an insulating substrate 2, and a semiconductor layer 36 forming a channel layer and formed above the gate electrode 17 with an intervening gate insulator 9 therebetween. Also, source electrode 11 and drain electrode 12 are formed between the insulating substrate 2 and the semiconductor layer 36 so as to connect directly to the semiconductor layer 36. Usually, a cap layer is stacked over the gate electrode 17, source and drain electrodes 11 and 12 and semiconductor layer 36. Further, lead electrodes, which are not shown for avoiding complicated illustration, are connected to respective of the source and drain electrodes 11 and 12.

FIG. 15 is a sectional view schematically illustrating a process for fabricating the thin film transistor according to embodiment 7 of the present invention. In FIG. 15, some conventional parts or components required in fabricating the thin film transistor are omitted for avoiding complicated illustration.

Firstly, as shown in FIG. 15(*a*), an aluminum film is formed to a thickness of 300 nm on a surface of the insulating substrate 2 comprising a plastic substrate or a glass substrate, followed by photolithography and etching to form the gate electrode 17. Subsequently, a polyimide film having a thickness of 100 nm is formed to cover the gate electrode 17 and the exposed portion of the substrate 2 by spin coating, to form the gate insulator 9.

Subsequently, an indium tin oxide film (ITO) as a conductive thin film is formed to a thickness of 300 nm on the upper side of the gate insulator 9 by EB evaporation at a substrate temperature of 100° C. The indium tin oxide film is then subjected to photolithography and etching to form the source and drain electrodes 11 and 12. Thereafter, at least a portion of the gate insulator 9 lying between the source and drain electrodes 11 and 12 is subjected to an orientation treatment. The method of orientation treatment employed here includes rubbing the surface of the gate insulator 9 with dust-free cloth in a predetermined direction, like the method employed in embodiment 6. Such an orientation treatment allows a liquid crystalline organic compound contained in a mixed composition layer, which is to be described later, to be oriented in a direction parallel with the rubbing direction. While the surface of the gate insulator 9 is subjected to the orientation treatment after the formation of the source and drain electrodes 11 and 12 according to the above-described embodiment, there is no limitation to this embodiment. For example, it is possible to form the source and drain electrodes 11 and 12 on the upper side of the polyimide gate insulator 9 having undergone the orientation treatment.

In turn, the semiconductor layer 36 comprising an organic semiconductor film is formed on the upper side of the gate insulator 9 to serve as a channel layer, as shown in FIG. 14. The semiconductor layer 36 is formed in the following manner as in the formation of the conductive thin film of embodiment 6.

As in embodiment 6, firstly, a material is provided comprising at least such a low polymer organic semiconductor compound as the oligothiophene derivative having a smectic phase as a liquid crystalline phase of a high order at a high temperature, for example, Dec-5T-Dec shown in FIG. 16. Here, it is possible to use a material comprising at least 4 to 6 thiophene rings bonded to each other as the thiophene derivative.

Also provided is an organic compound which exhibits the second liquid crystalline phase like a nematic phase of a low order (i.e., a liquid crystalline phase of low symmetry), for example, a biphenyl-type compound shown in FIG. 17(a). Thereafter, a mixed composition is prepared by mixing at least 93 wt % of the oligothiophene derivative Dec-5T-Dec as the organic semiconductor compound and 7 wt % of the biphenyl-type liquid crystal compound as the organic compound together. The mixed composition is then blended with an organic solvent such as chlorobenzene for easy coating.

Figure 15A:
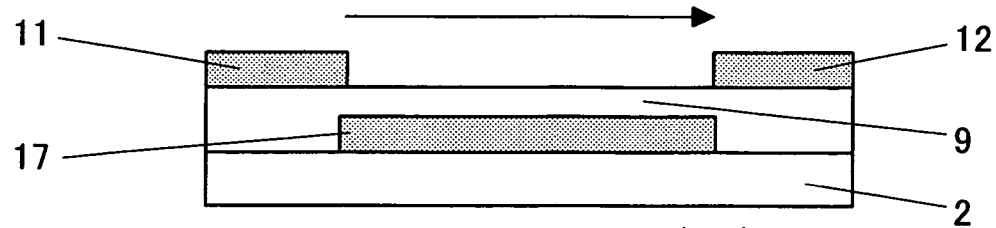
FIG. 15 is a sectional view schematically illustrating a process for fabricating the thin film transistor according to embodiment 7 of the present invention.
Figure 15B:
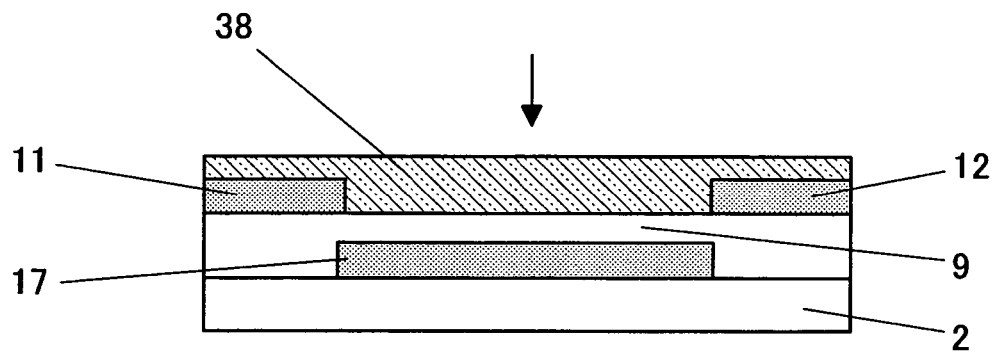

Subsequently, a solution of the aforementioned mixed composition thus prepared is coated to the exposed portion of the polyimide gate insulator 9 having a surface orientation-treated by rubbing in the predetermined direction and to the upper side of the source and drain electrodes 11 and 12 by a dropping method to form a film having a thickness of about 1 μm, as shown in FIG. 15(b). Thereafter, at least a solution portion of the mixed composition is heated to dissipate the organic solvent from the solution of the mixed composition, thus forming a mixed composition layer 38 containing 93 wt % of the oligothiophene derivative as the organic semiconductor compound.

Though the mixture ratio between the organic semiconductor compound and the organic compound depends upon the kinds of the two materials to be used or the desired electrical characteristics, the mixed composition layer preferably contains the organic semiconductor compound in a highest possible proportion, so that desired high characteristics can be obtained easily. The mixed composition layer 38 desirably contains 70 to 98 wt % of the organic semiconductor compound, more desirably 90 to 95 wt % of the organic semiconductor compound. Such a mixed composition layer can obtain more favorable characteristics. The mixture ratio of the organic semiconductor compound in the mixed composition layer 38 is not limited to the above-noted mixture ratios but may be appropriately adjusted to the kind of the organic semiconductor compound or the required electrical characteristics.

Figure 15C:
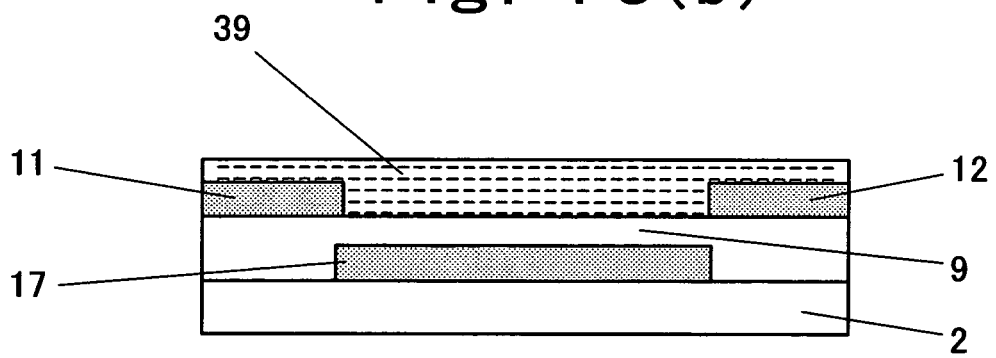

Subsequently, as shown in FIG. 15(c), the mixed composition layer 38 coating at least the space between the source and drain electrodes 11 and 12 is left within a predetermined temperature range that allows the mixed composition to exhibit a nematic phase as the second liquid crystalline phase of a low order containing the oligothiophene derivative shown in FIG. 16. By so doing, the mixed composition 38 comprising the mixture of the organic semiconductor compound Dec-5T-Dec (93 wt %) and the organic compound (7 wt %) exhibits nematic phase 39 within the temperature range from 160° C. to 167° C. in conformance with the phase diagram at FIG. 13.

Figure 15D:
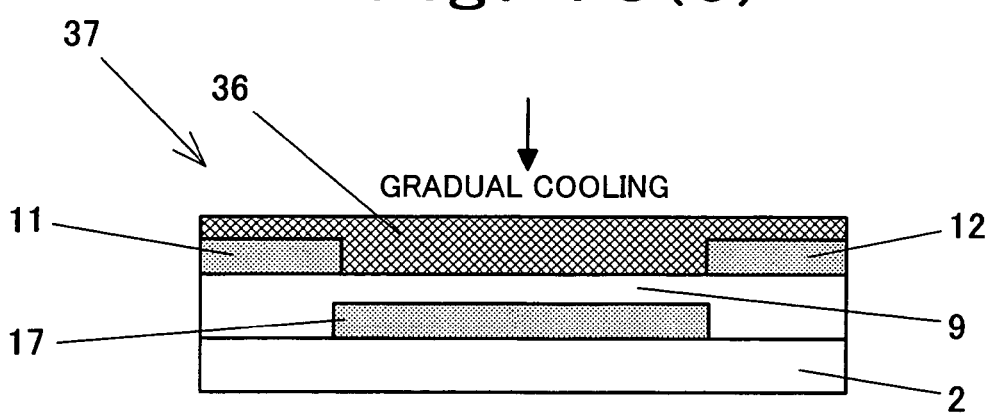

Subsequently, as shown in FIG. 15(d), the nematic phase 39 exhibited in at least the space between the source and drain electrodes 11 and 12 and the boundaries thereof is gradually cooled and solidified to form the semiconductor layer 36 as an organic semiconductor layer comprising the mixed composition layer 38 containing 93 wt % of the organic semiconductor compound and oriented in the predetermined direction. Thus, the semiconductor layer 36 of the thin film transistor 37 shown in FIG. 14 is completed. In the semiconductor layer 36 of the thin film transistor 37, molecules of the oligothiophene derivative as the organic semiconductor compound mixed with the biphenyl-type compound, specifically, the skeletal chains of the oligothiophene derivative in which thiophene rings are bonded to each other, are aligned in the substantially fixed predetermined direction (for example, in the direction from the source electrode 11 toward the drain electrode 12) relative to the biphenyl-type liquid crystal compound oriented in the desired fixed direction by the orientation treatment.

The thin film transistor 37 having the semiconductor layer 36 as the organic semiconductor layer formed according to the present embodiment exhibited a high carrier mobility at channel as high as $10^{-2}$ cm$^2$/Vs. Thus, it was confirmed from this result that the semiconductor layer 36 containing the oligothiophene derivative oriented in the substantially fixed predetermined direction was improved in electrical characteristics. In contrast, a thin film transistor having a semiconductor layer formed using the same oligothiophene derivative as used in the present embodiment by mere vapor deposition exhibited a low carrier mobility as low as $10^{-3}$ cm$^2$/Vs.

According to the present embodiment having been described above, the mixed composition layer is formed by coating the space between the source and drain electrodes formed on the substrate with the mixed composition comprising a mixture of the organic semiconductor compound having the first liquid crystalline phase of a high order at a high temperature and the organic compound exhibiting the second liquid crystalline phase of a low order and then left within the predetermined temperature range that allows the mixed composition layer to exhibit the second liquid crystalline phase of a low order containing the organic semiconductor compound. Thereafter, the mixed composition layer lying between the source and drain electrodes is allowed to exhibit the second liquid crystalline phase, which is then oriented in the desired direction. By so doing, the molecules of the organic semiconductor compound also are oriented in the predetermined direction. In this way, the conductive thin film is formed which is enhanced in charge transport performance by favorably orienting the molecules of the organic semiconductor compound. By utilizing this conductive thin film as a semiconductor layer, the thin film transistor having further improved carrier mobility at channel is fabricated.

Preferably, the first liquid crystalline phase is a smectic phase and the second liquid crystalline phase is a nematic phase. By combining controls over these liquid crystalline phases, the semiconductor layer can be formed easily.

The organic semiconductor compound comprises a low polymer of an organic semiconductor compound such as the oligothiophene derivative. If a conductive thin film is formed in which such a low polymer of the organic semiconductor compound is oriented substantially uniformly, use of such a conductive thin film as the semiconductor layer in a thin film transistor will make it possible to improve the thin film transistor in such electrical characteristics as carrier mobility at channel.

The above-described temperature at which the organic compound exhibits a nematic liquid crystalline phase may be lower or higher than the temperature at which the organic semiconductor compound exhibits a smectic phase.

The above-described oligothiophene derivative used as the organic semiconductor compound may be any oligothiophene derivative which exhibits a smectic phase with no limitation on the number of thiophene rings or the length of the alkyl group.

While the above-described embodiment uses the oligothiophene derivative as the organic semiconductor compound, the present invention is not limited to this embodiment but can be practiced similarly with use of any one of materials which are each capable of exhibiting a smectic phase, including derivatives of such low polymer organic semiconductor compounds as pentacene, tetracene, phenylene derivative, phthalocyanine compound, cyanine dye, and the like.

While the above-described embodiment uses a cyanobiphenyl- or cyanoterphenyl-type nematic liquid crystal compound as the organic compound, it is possible to use nematic liquid crystal compounds each having a substantially rod-like molecular structure such as phenylcyclohexane (PCH)-type, phenyl ester-type, phenylpyrimidin-type, phenyldioxane-type, and tolan-type nematic liquid crystal compounds, nematic liquid crystal compounds of other types, and mixed nematic liquid crystal compounds each comprising a mixture thereof. Though the above-described embodiment uses a nematic liquid crystal compound as the organic compound, the present invention is not limited to this embodiment but may use a lyotropic liquid crystal.

In cases where a cyanobiphenyl- or cyanoterphenyl-type nematic liquid crystal compound having a high-polarity group, such as a cyano or fluoro group or other group, at terminal is used as the organic compound, the organic semiconductor compound may be oriented by utilizing an electric field generated by application of voltage across the source and drain electrodes instead of the above-described orientation film having undergone the orientation treatment.

The above-described mixed composition can serve the purpose as long as the mixed composition comprises at least the aforementioned organic semiconductor compound and the aforementioned organic compound. The mixed composition may contain other materials such as a charge polarity imparting agent.

The kind of the organic solvent described above may be appropriately selected depending upon the kind of the organic semiconductor compound selected. For example, it is possible to use an aromatic solvent such as chloroform, 1,2,4-trichlorobenzene or the like, as well as chlorobenzene mentioned above. It is also possible to use such an organic solvent as tetrahydrofuran, diethyl glycol, diethyl ether or the like.

Methods of coating of the above-described mixed composition include casting, spinner coating, dip coating, such printing as screen printing, roll coating, ink-jet coating, spray coating, and a like method, in addition to the aforementioned dropping.

Methods of orienting the above-described liquid crystalline phase in any predetermined direction include: a method including applying the organic semiconductor film with an electric field; a method including applying the organic semiconductor film with a magnetic field; and a like method, in addition to the above-described method including forming the organic semiconductor film on the orientation film having undergone the orientation treatment.

Examples of orientation films for use in the above-described embodiment include inorganic-type orientation films such as a silicon oxide film and the like, and organic-type orientation films such as a nylon film, polyvinyl alcohol film, polyimide film, monomolecular film, and the like. These orientation films can be formed by oblique vapor deposition or rotary vapor deposition and oriented by using a polymer liquid crystal or an LB film or by utilizing a magnetic field, spacer edge method, rubbing, or the like. Such an orientation film may be formed to have only the function as an orientation film or various functions as an insulating film, gate insulator and the like. It is possible to use a surface of an insulating substrate as an orientation film.

While the above-described embodiment utilizes the organic semiconductor layer formed from the mixed composition comprising the organic semiconductor compound and the liquid crystalline organic compound as the semiconductor layer of the thin film transistor, the present invention is not limited to this embodiment but may utilize a composite-type semiconductor layer formed from a mixed composition comprising a composite-type semiconductor material composed of an organic semiconductor compound and semiconductive carbon nanotube, and a liquid crystalline organic compound.

The above-described thin film transistor according to the present embodiment comprises the gate insulator, the semiconductor layer disposed in contact with the gate insulator, the gate electrode disposed in contact with one side of the gate insulator on the side opposite away from the semiconductor layer, and the source and drain electrodes disposed in contact with at least one side of the semiconductor layer and aligned with the gate electrode so as to be opposed to each other across the gate electrode. While the thin film transistor according to the present invention has been described as a bottom-gated thin film transistor having the gate electrode on the substrate, or on the bottom, the thin film transistor of the present invention may be a top-gated thin film transistor having the gate electrode on the gate insulator on the side opposite away from the substrate, or on the top.

In the fabrication of the thin film transistor 37 according to embodiment 7 of the present invention, the material usable for the gate electrode 17 and the source and drain electrodes 11 and 12 may be any material which is electrically conductive and unreactive to any one of the substrate 2 and the semiconductor layer 36. Examples of such usable materials include doped silicon, precious metals such as gold, silver, platinum and palladium, alkali metals or alkali earth metals such as lithium, cesium, calcium and magnesium, and metals such as copper, nickel, aluminum, titanium and molybdenum, or alloys thereof. Other usable materials include conductive organic materials such as polypyrrole, polythiophene, polyaniline and polyphenylenevinylene. Since the thin film transistor is operable if the gate electrode has a higher electric resistance than other electrodes, the gate electrode in particular may comprise a material different from that of the source and drain electrodes.

The material usable for the aforementioned gate insulator 9 may be any material which has an electric insulating property and is unreactive to any one of the substrate 2, electrodes and semiconductor layer 36. The substrate 2 and the gate insulator 9 may be in a form wherein a typical silicon oxide film is formed on silicon so as to be used as the gate insulator, or in a form wherein a thin layer of resin or the like is formed after the formation of an oxide film so as to function as the gate insulator. The gate insulator 9 may be formed by deposition of a compound consisting of elements different from those forming the substrate 2 and from those forming the electrodes by means of CVD, vapor deposition, sputtering or the like, or by coating, spraying, electrodeposition or the like of a solution of such a compound. Since it is known that a material having a high dielectric constant is used as the material for the gate insulator 9 in order to lower the gate voltage of the thin film transistor 37, the gate insulator 9 may be formed using a compound having a high dielectric constant other than ferroelectric compounds and ferroelectrics. Besides inorganic materials, it is possible to use organic materials having high dielectric constants such as polyvinylidene fluoride compounds, polyvinylidene cyanide compounds and the like.

Since the present embodiment can use the conventional low-temperature thin film formation technology in the formation of a thin film or a semiconductor layer, it is possible to use, besides a flexible plastic sheet that can be bent and a thin glass substrate, a resin film substrate having suppleness such as a thin polyimide film as the aforementioned substrate 2. For example, it is possible to use polyethylene film, polystyrene film, polyester film, polycarbonate film, polyimide film and a like film. Such a film also can provide for a flexible paper display, sheet display or the like having a substrate comprising a plastic sheet or a resin film.

INDUSTRIAL APPLICABILITY

The conductive thin film, thin film transistor and method of fabricating them according to the present invention are useful as conductive thin film, thin film transistor and method of fabricating them in realizing microminiaturized and higher-performance semiconductor circuits and display devices. Also, the conductive thin film, thin film transistor and method of fabricating them are useful as conductive thin film, thin film transistor and method of fabricating them in realizing paper-like or sheet-shaped image display devices, mobile devices using small-sized and high-performance semiconductor circuit devices, disposable devices such as a wireless IC tag, or other electronic devices, robots, microminiaturized medical instruments, or the like. Further, the conductive thin film, thin film transistor and method of fabricating them are useful as conductive thin film, thin film transistor and method of fabricating them in fabricating such a semiconductor circuit device, display device or the like inexpensively.

The invention claimed is:

1. A conductive thin film which is formed by mixing at least a non-liquid-crystalline organic semiconductor compound and a non-liquid-crystalline organic compound to form a liquid crystalline organic semiconductor mixture and orienting molecules of the liquid crystalline organic semiconductor mixture to cause molecules of the organic semiconductor compound to be oriented.

2. The conductive thin film according to claim 1, wherein said liquid crystalline organic semiconductor mixture is a liquid crystalline organic semiconductor mixture in which said organic semiconductor compound and said organic compound are hydrogen-bonded to each other.

3. The conductive thin film according to claim 2, wherein one of said organic semiconductor compound and said organic compound is a compound having at least one element selected from nitrogen, oxygen, sulfur and halogen and the element selected is hydrogen-bonded to hydrogen.

4. The conductive thin film according to claim 3, wherein the one of said organic semiconductor compound and said organic compound which has at least said element selected is a compound further having at least one of an unsaturated bond and a benzene ring.

5. The conductive thin film according to claim 1, wherein said organic semiconductor compound is a derivative comprising an organic semiconductor compound of at least any one of an acene type, a phthalocyanine type and a thiophene type.

6. The conductive thin film according to claim 5, wherein the derivative comprising an organic semiconductor compound of said acene type is a pentacene derivative.

7. The conductive thin film according to claim 5, wherein the derivative comprising an organic semiconductor compound of said phthalocyanine type is a copper phthalocyanine derivative.

8. The conductive thin film according to claim 1, which is formed by orienting molecules of said organic semiconductor mixture to cause molecules of said liquid crystalline organic semiconductor compound to be oriented and then removing said organic compound from said liquid crystalline organic semiconductor mixture.

9. The conductive thin film according to claim 8, which is formed by removing said organic compound from said liquid crystalline organic semiconductor mixture by at least one of heating and ultraviolet irradiation.

10. A thin film transistor comprising a conductive thin film as recited in claim 1 as a semiconductor layer forming a channel layer.

11. An image display device comprising a conductive thin film as recited in claim 1 as at least one of a conductive layer and a semiconductor layer forming a channel layer of a thin film transistor.

12. An electronic device comprising a conductive thin film as recited in claim 1 as at least one of a conductive layer and a semiconductor layer forming a channel layer of a thin film transistor.

13. A conductive thin film, which is formed by mixing at least an organic semiconductor compound having a first liquid crystalline phase in which crystallization temperature allowing crystallization from the liquid crystalline phase to occur is not lower than room temperature and an organic compound exhibiting a second liquid crystalline phase of a lower orientational order than the first liquid crystalline phase within a temperature range that is higher than the crystallization temperature of the organic semiconductor compound so as to contain 70 to 98 wt % of said organic semiconductor compound to form a mixed composition and orienting the mixed composition in the second liquid crystalline phase exhibited within a predetermined temperature range to cause molecules of the organic semiconductor compound to be oriented.

14. The conductive thin film according to claim 13, wherein said first liquid crystalline phase is a smectic liquid crystalline phase, while said second liquid crystalline phase is a nematic liquid crystalline phase.

15. The conductive thin film according to claim 13, wherein said organic semiconductor compound is an organic semiconductor compound comprising a low polymer organic semiconductor compound.

16. The conductive thin film according to claim 13, wherein said mixed composition is a mixed composition containing 90 to 95 wt % of said organic semiconductor compound.

17. The conductive thin film according to claim 13, wherein said organic semiconductor compound is an organic semiconductor compound comprising an oligothiophene derivative.

18. A thin film transistor comprising a conductive thin film as recited in claim 13 as a semiconductor layer forming a channel layer.

19. An image display device comprising a conductive thin film as recited in claim 13 as at least one of a conductive layer and a semiconductor layer forming a channel layer of a thin film transistor.

20. An electronic device comprising a conductive thin film as recited in claim 13 as at least one of a conductive layer and a semiconductor layer forming a channel layer of a thin film transistor.

21. A method of fabricating a conductive thin film comprising: mixing at least a non-liquid-crystalline organic semiconductor compound and a non-liquid-crystalline organic compound to form a liquid crystalline organic semiconductor mixture; and orienting molecules of the liquid crystalline organic semiconductor mixture to cause molecules of the organic semiconductor compound to be oriented.

22. The method according to claim 21, wherein a liquid crystalline organic semiconductor mixture in which said organic semiconductor compound and said organic compound are hydrogen-bonded to each other is used as said liquid crystalline organic semiconductor mixture.

23. The method according to claim 22, wherein a compound having at least one element selected from nitrogen, oxygen, sulfur and halogen is used as one of said organic semiconductor compound and said organic compound and the element selected is hydrogen-bonded to hydrogen.

24. The method according to claim 23, wherein a compound further having one of an unsaturated bond and a benzene ring is used as the one of said organic semiconductor compound and said organic compound which has at least said element selected.

25. The method according to claim 21, wherein a derivative comprising an organic semiconductor compound of at least any one of an acene type, a phthalocyanine type and a thiophene type is used as said organic semiconductor compound.

26. The method according to claim 25, wherein a pentacene derivative is used as the derivative comprising an organic semiconductor compound of said acene type.

27. The method according to claim 25, wherein a copper phthalocyanine derivative is used as the derivative comprising an organic semiconductor compound of said phthalocyanine type.

28. The method according to claim 21, which comprises: orienting molecules of said liquid crystalline organic semiconductor mixture to cause molecules of said organic semiconductor compound to be oriented; and then removing said organic compound from said liquid crystalline organic semiconductor mixture.

29. The method according to claim 28, which comprises removing said organic compound from said liquid crystalline organic semiconductor mixture by at least one of heating and ultraviolet irradiation.

30. A method of fabricating a thin film transistor, comprising a method of fabricating a conductive thin film as recited in claim 21 as a method of fabricating a conductive thin film serving as a semiconductor layer forming a channel layer.

31. A method of fabricating a conductive thin film comprising: mixing at least an organic semiconductor compound having a first liquid crystalline phase in which crystallization temperature allowing crystallization from the liquid crystalline phase to occur is not lower than room temperature and an organic compound exhibiting a second liquid crystalline phase of a lower orientational order than the first liquid crystalline phase within a temperature range that is higher than the crystallization temperature of the organic semiconductor compound so as to contain 70 to 98 wt % of said organic semiconductor compound to form a mixed composition; and orienting the mixed composition in the second liquid crystalline phase exhibited within a predetermined temperature range to cause molecules of the organic semiconductor compound to be oriented.

32. The method according to claim 31, wherein a smectic liquid crystalline phase is used as said first liquid crystalline phase and a nematic liquid crystalline phase is used as said second liquid crystalline phase.

33. The method according to claim 31, wherein an organic semiconductor compound comprising a low polymer organic semiconductor compound is used as said organic semiconductor compound.

34. The method according to claim 31, wherein a mixed composition containing 90 to 95 wt % of said organic semiconductor compound is used as said mixed composition.

35. The method according to claim 31, wherein an organic semiconductor compound comprising an oligothiophene derivative is used as said organic semiconductor compound.

36. A method of fabricating a thin film transistor, comprising a method of fabricating a conductive thin film as recited in claim 31 as a method of fabricating a conductive thin film serving as a semiconductor layer forming a channel layer.

* * * * *